United States Patent
Jun et al.

(10) Patent No.: US 12,266,570 B2
(45) Date of Patent: Apr. 1, 2025

(54) SELF-ALIGNED INTERCONNECT STRUCTURES AND METHODS OF FABRICATION

(71) Applicant: Intel Corporation, Santa Clara, CA (US)

(72) Inventors: Kimin Jun, Portland, OR (US); Souvik Ghosh, Beaverton, OR (US); Willy Rachmady, Beaverton, OR (US); Ashish Agrawal, Hillsboro, OR (US); Siddharth Chouksey, Portland, OR (US); Jessica Torres, Portland, OR (US); Jack Kavalieros, Portland, OR (US); Matthew Metz, Portland, OR (US); Ryan Keech, Portland, OR (US); Koustav Ganguly, Beaverton, OR (US); Anand Murthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 874 days.

(21) Appl. No.: 17/133,065

(22) Filed: Dec. 23, 2020

(65) Prior Publication Data
US 2022/0199468 A1    Jun. 23, 2022

(51) Int. Cl.
    *H01L 21/768*    (2006.01)
    *H01L 23/00*    (2006.01)
    (Continued)

(52) U.S. Cl.
    CPC .... *H01L 21/76897* (2013.01); *H01L 23/5226* (2013.01); *H01L 24/83* (2013.01);
    (Continued)

(58) Field of Classification Search
    CPC .......... H01L 21/76897; H01L 23/5226; H01L 24/83; H01L 29/401; H01L 29/41791;
    (Continued)

(56) References Cited

U.S. PATENT DOCUMENTS

2005/0059236 A1   3/2005   Nishida et al.
2007/0267723 A1   11/2007   Bernstein et al.
(Continued)

OTHER PUBLICATIONS

Extended European Search Report from European Patent Application No. 21197426.6 notified Mar. 21, 2022, 10 pgs.

*Primary Examiner* — Kretelia Graham
*Assistant Examiner* — Jaesun Lee
(74) *Attorney, Agent, or Firm* — Essential Patents Group, LLP

(57) ABSTRACT

An integrated circuit interconnect structure includes a metallization level above a first device level. The metallization level includes an interconnect structure coupled to the device structure, a conductive cap including an alloy of a metal of the interconnect structure and either silicon or germanium on an uppermost surface of the interconnect structure. A second device level above the conductive cap includes a transistor coupled with the conductive cap. The transistor includes a channel layer including a semiconductor material, where at least one sidewall of the conductive cap is co-planar with a sidewall of the channel layer. The transistor further includes a gate on a first portion of the channel layer, where the gate is between a source region and a drain region, where one of the source or the drain region is in contact with the conductive cap.

20 Claims, 15 Drawing Sheets

(51) Int. Cl.
  *H01L 23/522* (2006.01)
  *H01L 29/08* (2006.01)
  *H01L 29/40* (2006.01)
  *H01L 29/417* (2006.01)
  *H01L 29/45* (2006.01)
  *H01L 29/66* (2006.01)
  *H01L 29/78* (2006.01)
  *H10B 61/00* (2023.01)
  *H10B 63/00* (2023.01)

(52) U.S. Cl.
  CPC ...... *H01L 29/401* (2013.01); *H01L 29/41791* (2013.01); *H01L 29/45* (2013.01); *H01L 29/456* (2013.01); *H01L 29/66795* (2013.01); *H10B 61/22* (2023.02); *H10B 63/30* (2023.02); *H01L 29/0847* (2013.01); *H01L 29/785* (2013.01); *H01L 2224/83048* (2013.01); *H01L 2224/83359* (2013.01)

(58) Field of Classification Search
  CPC . H01L 29/45; H01L 29/456; H01L 29/66795; H01L 29/0847; H01L 29/785; H01L 2224/83048; H01L 2224/83359; H01L 21/8221; H10B 61/22; H10B 63/30
  See application file for complete search history.

(56) References Cited

U.S. PATENT DOCUMENTS

| | | | |
|---|---|---|---|
| 2010/0301395 A1* | 12/2010 | Xu | H01L 29/7785 257/E21.403 |
| 2011/0168434 A1* | 7/2011 | Farooq | H01L 21/2007 174/257 |
| 2011/0193240 A1* | 8/2011 | Farooq | H01L 25/0657 228/199 |
| 2016/0035702 A1 | 2/2016 | Luo | |
| 2017/0294398 A1* | 10/2017 | Happoya | H01L 24/32 |
| 2019/0164893 A1* | 5/2019 | Kim | H01L 23/49827 |
| 2019/0326353 A1* | 10/2019 | O'Brien | H01F 10/3254 |
| 2019/0371671 A1 | 12/2019 | Fenouillet-Beranger et al. | |
| 2020/0135897 A1* | 4/2020 | Duriez | H01L 21/823418 |

* cited by examiner

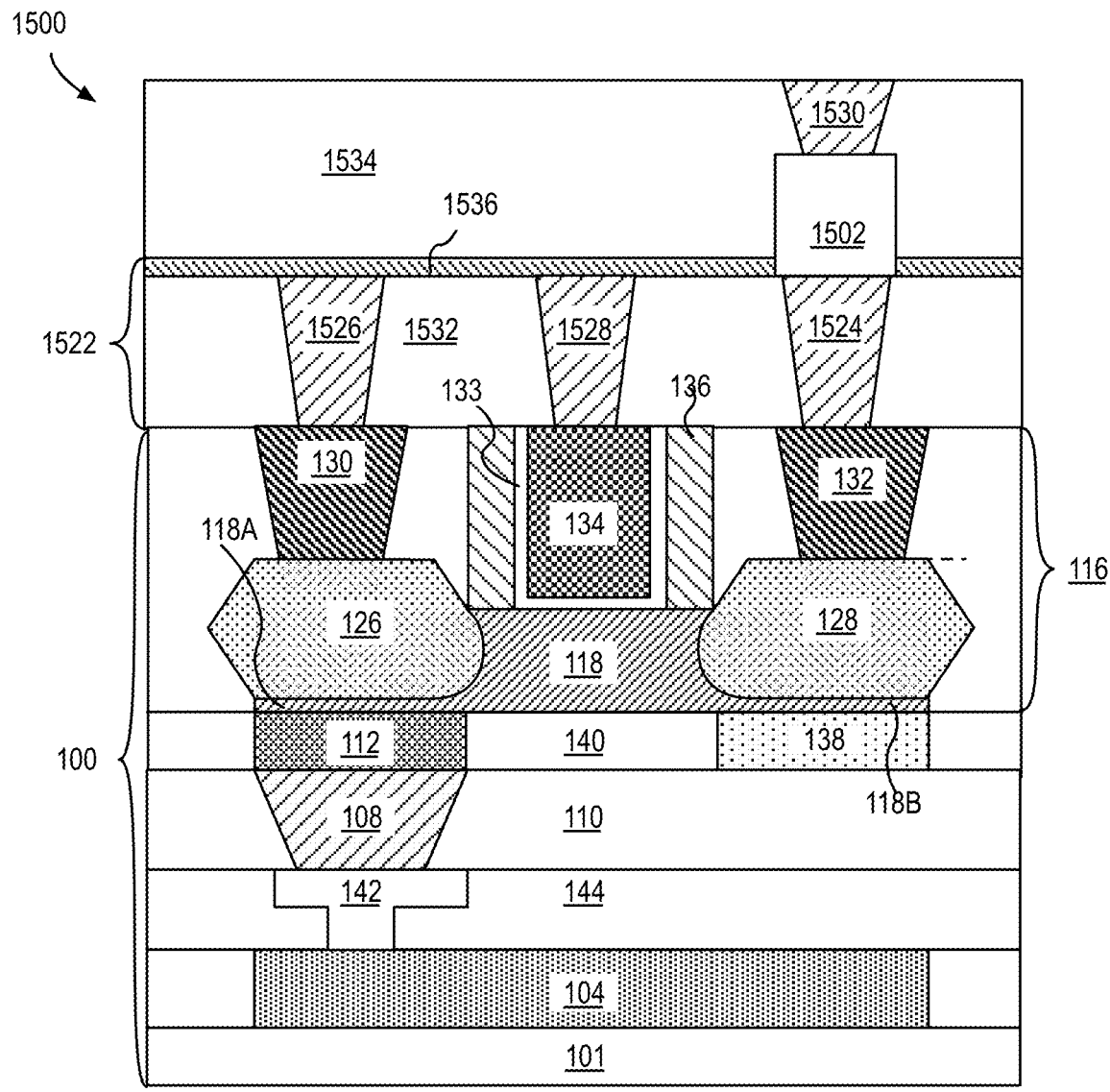
FIG. 15A
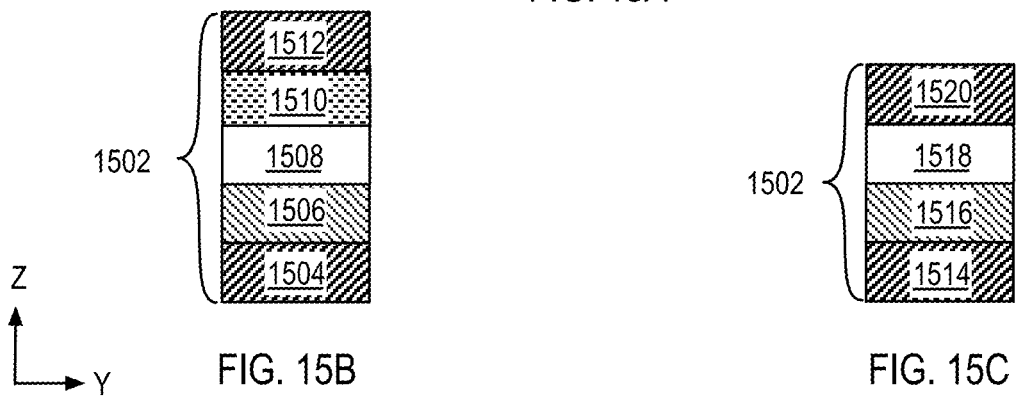
FIG. 15B
FIG. 15C

SELF-ALIGNED INTERCONNECT STRUCTURES AND METHODS OF FABRICATION

BACKGROUND

Stacking of device structures (such as transistors) have been proposed to enable high density scaling at smaller device dimensions. However, integrated circuit structures that connect stacked devices are significantly more challenging to fabricate when devices are not only made smaller but are densely packed. Integrated circuit structures can be routed from a top device to a bottom device, through an intervening dielectric, but significant problems can arise from misalignment between top and bottom device and from intervening structures on the top device. As such, improvements in methods to form integrated circuit structures between two device levels are needed.

BRIEF DESCRIPTION OF THE DRAWINGS

FIG. 15A is a cross-sectional illustration of the structure in FIG. 1 including a memory device coupled with the transistor on an upper device level.

FIG. 15B is a cross-sectional illustration of a magnetic tunnel junction device, in accordance with an embodiment of the present disclosure.

FIG. 15C is a cross-sectional illustration of a resistive random-access memory device, in accordance with an embodiment of the present disclosure.

DESCRIPTION OF THE EMBODIMENTS

Figure 1:
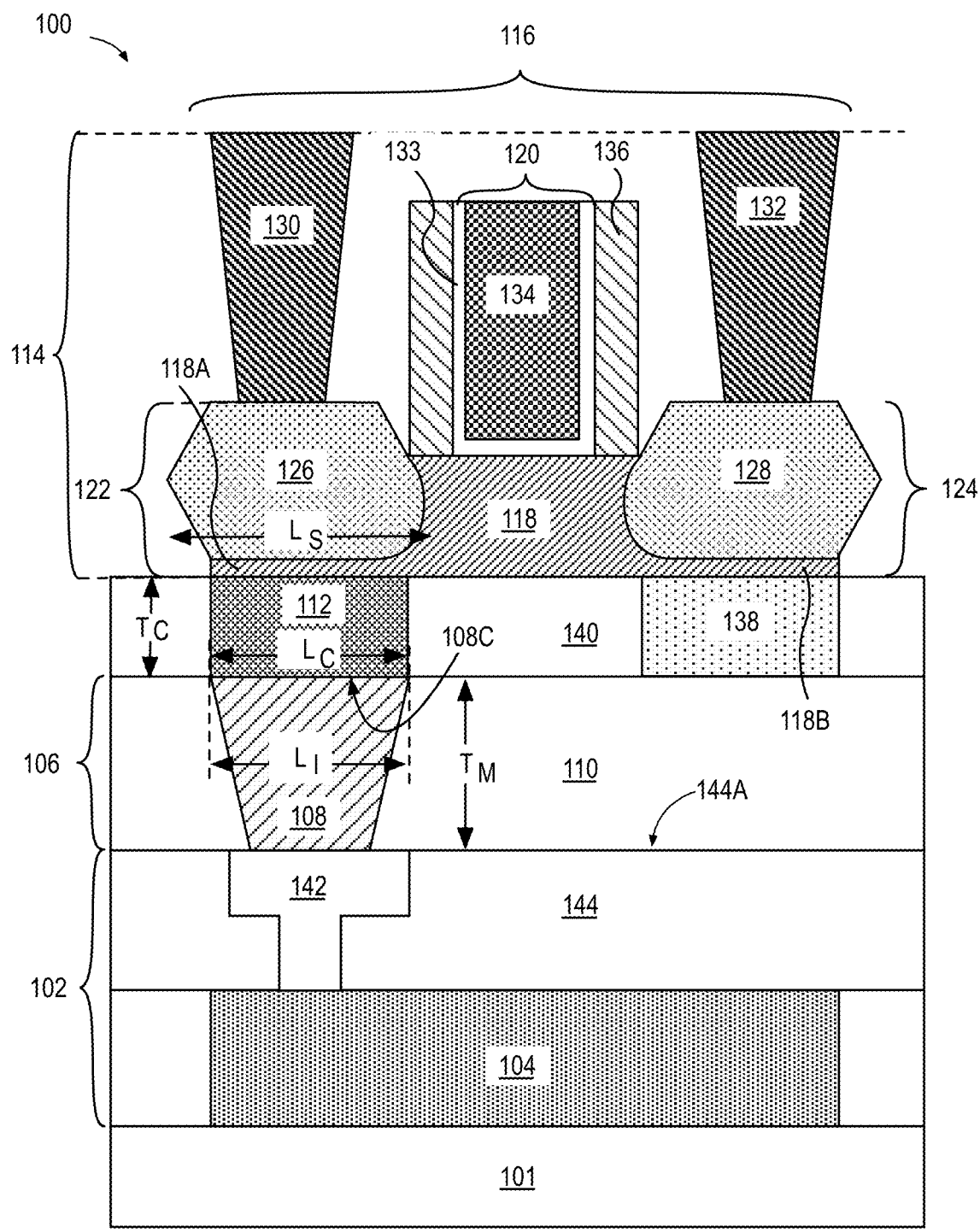
FIG. 1 illustrates a cross-sectional view of an integrated circuit interconnect structure between an upper and a lower device level, in accordance with an embodiment of the present disclosure.

An integrated circuit interconnect structure with self-aligned silicide or germanide structures and methods of fabrication are described. In the following description, numerous specific details are set forth, such as structural schemes and detailed fabrication methods in order to provide a thorough understanding of embodiments of the present disclosure. It will be apparent to one skilled in the art that embodiments of the present disclosure may be practiced without these specific details. In other instances, well-known features, such as transistor operations are described in lesser detail in order to not unnecessarily obscure embodiments of the present disclosure. Furthermore, it is to be understood that the various embodiments shown in the Figures are illustrative representations and are not necessarily drawn to scale.

In some instances, in the following description, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies. As used throughout this description, and in the claims, a list of items joined by the term "at least one of" or "one or more of" can mean any combination of the listed terms.

The term "adjacent" here generally refers to a position of a thing being next to (e.g., immediately next to or close to with one or more things between them) or adjoining another thing (e.g., abutting it).

The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

As used throughout this description, and in the claims, a list of items joined by the term "at least one of" or "one or more of" can mean any combination of the listed terms. Unless otherwise specified in the explicit context of their use, the terms "substantially equal," "about equal" and "approximately equal" mean that there is no more than incidental variation between two things so described. In the art, such variation is typically no more than +/−10% of a predetermined target value.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

The integrated circuit interconnect structure is an intervening substrate used to bridge a first substrate to a second substrate. The first substrate may be, for instance, an integrated circuit die including one or more transistors. The second substrate may be, for instance, a memory module, a computer motherboard, or another integrated circuit die including one or more transistors. Generally, the purpose of an integrated circuit interconnect structure is to spread a connection to a wider pitch or to reroute a connection to a different connection. For example, an integrated circuit interconnect structure may couple an integrated circuit die to one or more transistors that can subsequently be coupled to the second substrate. In some embodiments, the first and second substrates are mechanically bonded to opposing sides of the integrated circuit interconnect structure. In other embodiments, the first and second substrates are mechanically bonded to a same side of the integrated circuit interconnect structure. While methods utilized to mechanically bond two substrates have been developed, challenges arise in routing connections between devices in the two substrates without misalignment. In particular, while fabricating stacked device structures, routing connections between a top device and a bottom device is typically done through substantially thick layers of one or more dielectrics such as silicon oxide (oxide). In embodiments, the dielectric layer can be up to 200 nm thick. Dielectric such as silicon oxide is advantageous because it enables defect free bonding between two substrates and provides adequate electrical isolation.

To provide connectivity in a stacked device architecture, such as between transistors on an upper level of a stacked device with a device structure on a lower level, interconnect structures are utilized. In some embodiments, interconnect structures that extend from the transistors on the upper device level to the device structure may be formed. However, formation of such interconnects requires etching one or more vias into thick oxide layers and aligning the one or more vias between the transistor and a device. With scaling in device dimensions, nanometer level misalignment can result in vias not landing over a desired portion of the device structure in the lower level. In some examples, transistors include raised epitaxial source or drain structures that are wider than interconnect structures. When forming an interconnect structure that connects the transistor to the lower level device, the interconnect structure needs to be substantially wider than the epitaxial source or drain structures to enable physical connectivity. However, even in such examples, the epitaxial source or drain structure can divide a single via into two portions. Alternate methods include staggering (laterally separate) contacts on upper and lower levels of a bonded wafer and forming a bridge structure to connect them. However, both schemes may consume more area than is available in the vicinity of densely packed transistors. Furthermore, the latter scheme may require devices on two levels to be staggered to begin with, which can be highly inconvenient.

The inventors have found a solution to connect devices on two different levels that minimizes via misalignment, overcomes structural impediments in the top transistor and allows the dielectric that separates two device levels to be scaled as needed. In an embodiment, an interconnect structure can be formed adjacent to a dielectric over a first device structure on a first wafer. A first bonding layer including an amorphous semiconducting material can be deposited uniformly over the interconnect structure and the dielectric. The first wafer can then be bonded to a second wafer, where the second wafer includes a second bonding layer having a material that is the same or substantially the same as the material of the first bonding layer. In an embodiment, the first bonding layer and the second bonding layer can be bonded together to form an amorphous layer. The amorphous layer forms directly between the interconnect structure and the substrate of the second wafer. The substrate of the second wafer can be thinned and utilized to fabricate a channel layer of a device, such as a transistor. The process to bond the first wafer with the second wafer and thinning the second substrate forms a bonded wafer.

Portion of the amorphous layer directly in contact with and above the interconnect structure in the bonded wafer can be converted to be conductive. In exemplary embodiments the amorphous layer includes silicon, silicon-germanium or germanium. The bonded wafer can be heated where one or more metals in the interconnect structure can react with the amorphous layer to form a silicide or a germanide (converted amorphous region) for example. The material of the interconnect structure can be chosen to favor formation of a silicide or a germanide. Because diffusion of the one or more metals from the interconnect structure can be controlled, the silicide or the germanide is substantially limited to a perimeter region of an uppermost surface of the interconnect structure. Also, because the process to form a silicide or germanide is dependent on a contact area between the amorphous layer and the interconnect structure, the process will result in a silicide or a germanide being formed with a lowermost surface area that is the same or substantially the same as an area of an uppermost surface of the interconnect structure. The silicide or germanide is in physical contact with the thinned second substrate. In exemplary embodiments, the amorphous layer can be as thin as 2 nm.

In an embodiment, a mask can be formed over the substrate to pattern a source, a drain and a channel of a transistor, such as fin structure. The mask can be aligned so that that source or a drain region can be formed directly above the prefabricated interconnect structure. The substrate along with the thin amorphous layer can be etched together to form a fin structure and a conductive cap (patterned silicide or germanide) on the interconnect structure. It is to be appreciated that the shape and size of the conductive cap is determined by a relative overlap between the patterned fin structure and the interconnect structure. As such the patterned fin structure is aligned to the self-aligned cap and interconnect structures. The source or the drain region (whichever is in contact with the silicide or germanide) can be doped to make it electrically conductive. Once the fin structure is defined, the process to fabricate a transistor, such as for example, a non-planar transistor may be continued. The process can culminate with the formation of a contact structure on each of the source region and the drain region. The contact structures are electrically coupled with the device below through the source or drain region, the conductive cap and the interconnect structure.

FIG. 1 illustrates cross-sectional illustration of an integrated circuit structure 100 above a substrate 101, in accordance with an embodiment of the present disclosure. The integrated circuit interconnect structure 100, includes a device level 102 including a device structure 104. A metallization level 106 is above the device level 102, where the metallization level includes an interconnect structure 108 that is electrically coupled to the device structure 104. A conductive cap 112 is on at least a portion of an uppermost surface 108C of the interconnect structure 108, where the conductive cap 112 includes an alloy of a metal of the interconnect structure 108 and one or more of silicon or germanium. The integrated circuit structure 100 further includes a device level 114 above the conductive cap 112, where the second device level includes a transistor 116 coupled with the conductive cap 112. The transistor 116 includes a channel layer 118 including a semiconductor material, a gate 120 on a first portion of the channel layer, the gate between a source region 122 and a drain region 124. Either the source region 122 or the drain region 124 can be in contact with the cap structure 112. In the illustrative embodiment, the source region 122 is on and in contact with cap structure 112.

The source region 122 and drain region 124 may include a variety of different source-drain structures, such as raised source drain epitaxy or epitaxial cladding layers. In the illustrative embodiment, source region 122 includes a raised doped epitaxial source structure 126 (herein doped epitaxial source structure 126) on a portion 118A of the channel layer 118, and the drain region includes a raised doped epitaxial drain structure 128 (herein doped epitaxial drain structure 128) on a portion 118B of the channel layer 118. In exemplary embodiments, portions 118A and 118B are doped sufficiently to be electrically conductive to provide a current path to the cap structure 112. A source contact 130 is coupled with the source region 122 and a drain contact 132 is coupled with the drain region 128. In the illustrative embodiment, the source contact 130 is in contact with and coupled with the epitaxial source structure 126 and the drain contact 132 is in contact with and coupled with the epitaxial drain structure 128.

The interconnect structure 108 and cap structure 112 provide a low resistance current path between the source contact 130 and the device structure 104. As such, in exemplary embodiments, cap structure 112 includes a material that is a silicide or a germanide. The silicide or a germanide cap structure 112 can advantageously provide a low Schottky barrier height between the epitaxial source structure 126 and the interconnect structure 108. In embodiments, the cap structure 112 includes one or more metals of the interconnect structure 108. Materials of the interconnect structure 108 include titanium, cobalt, nickel, tungsten, platinum, rare earth metals such as Nd, Sm, Gd, Tb, Dy and Ho or combinations thereof. More specifically, the choice of metals are dependent on whether cap structure 112 is a silicide or germanide.

The cap structure 112 has lateral dimensions (in the x-y plane of the figure) that are dependent on a plan view shape of the interconnect structure 108, the channel layer 118 and relative alignment between them as will be discussed below (FIGS. 7A-7D). As such the cap structure 112 is advantageously self-aligned with the interconnect structure 108 as well as with portions of the channel layer 118. The cap structure 112 may or may not extend under the gate structure 120. However, in exemplary embodiments, the cap structure 112 does not extend beyond the source region 122. In the illustrative embodiment, the cap structure 112 has a lateral thickness, $L_C$, as measured along the y-direction, that is substantially similar to a lateral thickness, $L_I$ of the interconnect structure 108. In embodiments, $L_I$ is comparable to a lateral thickness, $L_S$, of the source region 122. In an embodiment, $L_I$ is between 10 nm and 20 nm. As shown, $L_I$, is a widest portion of a tapered interconnect structure 108.

In embodiments, a combined thickness of the interconnect structure 108 and the cap structure 112 can be adjusted to accommodate one or more devices within the metallization level 106 between device levels 102 and 114. The cap structure 112 has a vertical thickness, $T_C$, as measured from an uppermost surface 108C of the interconnect structure 108. In embodiments, $T_C$ is between 2 nm and 10 nm. The interconnect structure 108 has a vertical thickness, $T_M$, as measured along the z-direction, that is at least 10 nm. In some embodiments, $T_M$, is as much as 100 nm.

In the illustrative embodiment, a bonding layer 138 is below the drain region 124. Bonding layer is an artifact of a method utilized to fabricate cap structure 112 (as will be discussed in FIGS. 5A-5C). The bonding layer 138 and the cap structure 112 share a same semiconductive material, such as silicon, germanium or silicon germanium. The bonding layer 138 does not include a metallic component of the cap structure 112, and is thus, non-conductive. Furthermore, bonding layer 138 includes a material that is different from a material of the channel layer 118. In exemplary embodiments, channel layer 118 and bonding layer 138 may respectively include the following pairs of materials, for example: monocrystalline silicon and Ge; Si—Ge and amorphous silicon or Ge; or Ge and amorphous silicon. As shown, the cap structure 112 and the bonding layer 138 are separated by a dielectric 140. The dielectric 140 and the bonding layer 138 are above a dielectric 110 that is adjacent to interconnect structure 108.

Also as shown, the gate 120 further includes a gate dielectric layer 133 and a gate electrode 134 on the gate dielectric layer 133. The transistor 116 further includes a dielectric spacer 136 adjacent to gate dielectric layer 133. The spacer 136 includes a dielectric material such as silicon and one or more of nitrogen or carbon to provide electrical isolation between the gate 120 and the source region 122 or drain region 124.

Depending on the application, the device 104 may be a transistor, a memory device or a combination thereof. In the illustrative embodiment, the device 104 is a transistor having one or more features of the transistor 116. The source contact 130 is electrically coupled with the device 104, through the cap structure 112, interconnect structure 108 and the metallization structure 142. As such source contact 130 includes a conductive material that includes one or more of Ru, Ti, Co, Cu, Mo, Co, Ni, W, Ta, or nitrides of Ti, W or Ta. In embodiments, the drain contact 132 includes a material that is the same or substantially the same as the material of the source contact 132.

The interconnect structure 108 is electrically coupled with the device 104 through the metallization structure 142. In embodiments, metallization structure 142 is coupled to a source region of a transistor-device 104. In the illustrative embodiment, the metallization structure 142 is on a source region of a transistor-device 104. The device level 102 further includes a dielectric 144 that is, adjacent to metallization structure 142, and between dielectric 110 and device 104. While only one metallization structure such as metallization structure 142 is coupled with device 104 in the cross-sectional illustration, there may be more metallization structures (not shown) that are coupled to device 104 on a plane behind the y-z plane. In some embodiments, metallization structure 142 includes a material of the interconnect structure 108. In other embodiments, metallization structure 142 includes one or more of Ru, Ti, Co, Cu, Mo, Co, Ni, W, Ta, or nitrides of Ti, W or Ta. In embodiments dielectric 110, 140 and 144 include silicon and one or more of oxygen, carbon or nitrogen.

While a single self-aligned interconnect structure has been illustrated in FIG. 1, the integrated circuit interconnect structure 100 may include a plurality of interconnect structures that are each self-aligned to a corresponding cap structure such as interconnect structure 108 and cap structure 112. In some such embodiments, the interconnect structures that are self-aligned to a corresponding cap structure are further coupled between a corresponding device in each of the device levels 102 and 114.

Figure 2:
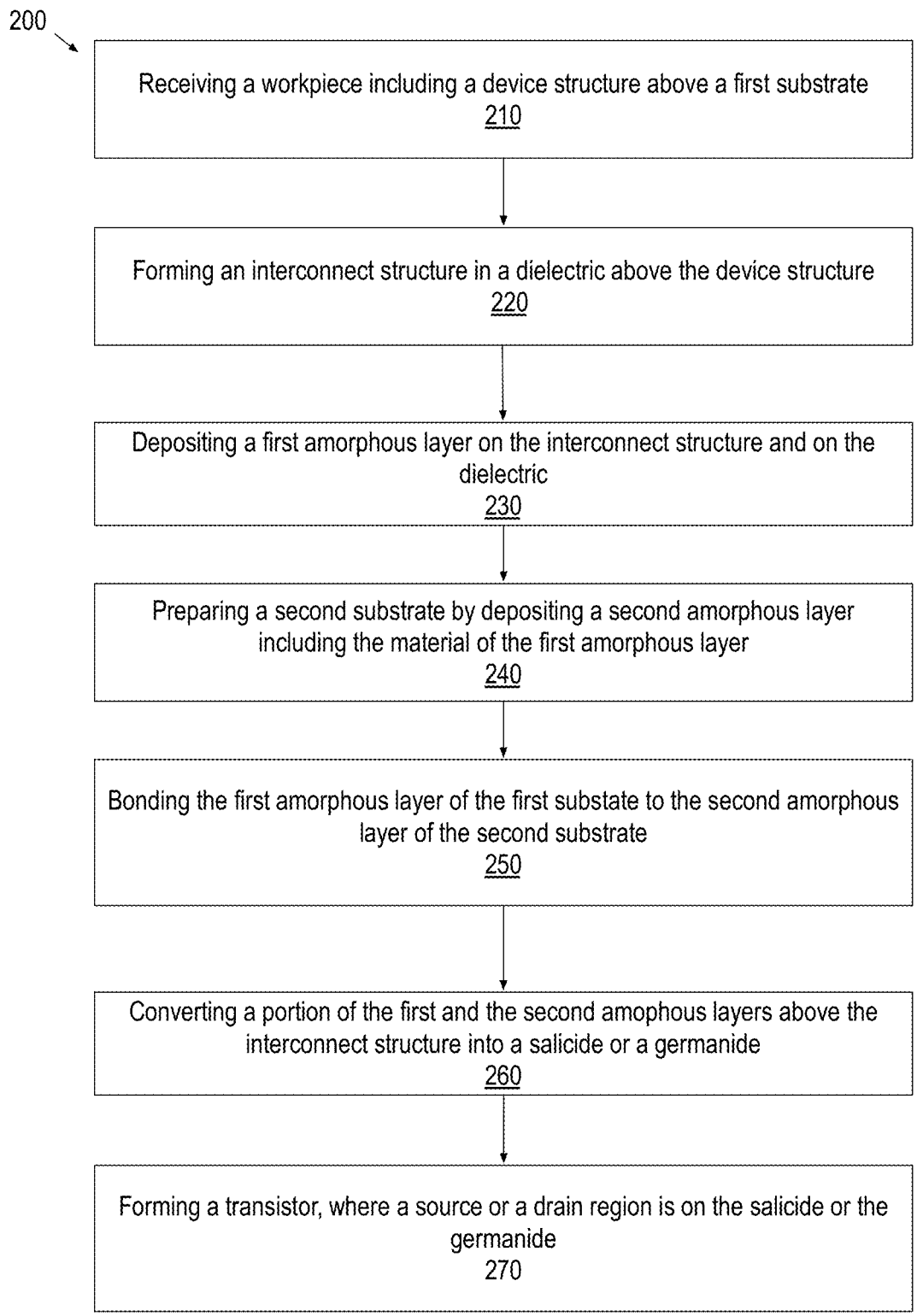
FIG. 2 illustrates a flow diagram for a method to fabricate an integrated circuit structure, in accordance with an embodiment of the present disclosure.

FIG. 2 illustrates a flow diagram for a method to fabricate an integrated circuit interconnect structure, in accordance with an embodiment of the present disclosure. The method 200 begins at operation 210 by receiving a work piece including a device structure formed above a first substrate. The method 200 continues at operation 220 with the formation of an interconnect structure in a dielectric above the device structure. The method 200 continues at operation 230 with the deposition of a first amorphous layer on an interconnect structure and on the dielectric. The method 200 continues at operation 240 the formation of a second amorphous layer on a second substrate. The method 200 continues at operation 250 with a process to chemically treat the first and the second amorphous layers and bond the first amorphous layer to the second amorphous layer. The method 200 continues at operation 260 with the process to convert the first and the second amorphous layers directly above the interconnect structure to form a silicide or a germanide The method concludes at operation 270 with a process to form a transistor, where a source or a drain region is directly on and coupled with the silicide or the germanide and a process to remove the first and second amorphous layers from a region under the gate region.

Figure 3A:
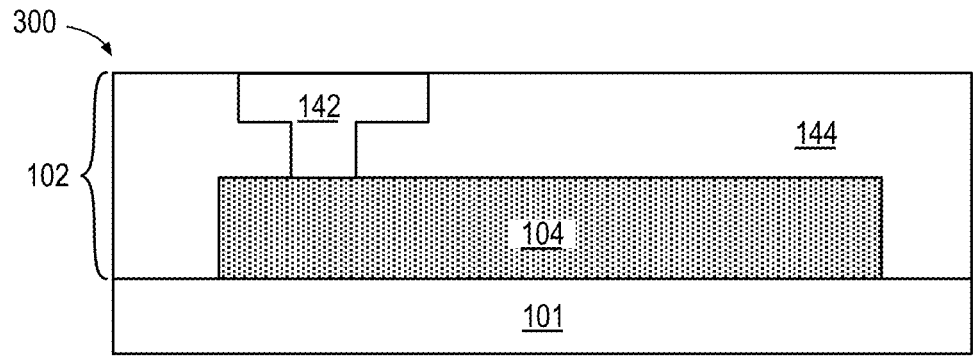
FIG. 3A illustrates a cross-sectional view of a first wafer including a metallization structure coupled with device, formed above a first substrate, in accordance with an embodiment of the present disclosure .

FIG. 3A illustrates a cross-sectional view of a wafer 300. Wafer 300 includes a device structure 104 formed above substrate 101, in accordance with an embodiment of the present disclosure. Device 104 is formed within device level 102. In an embodiment, device structure 104 includes a transistor, a transistor coupled with a non-volatile memory element, or a capacitor. The device structure 104 may generally include any semiconductor device. In the illustrative embodiment, the device structure 104 is a transistor 104 having one or more properties of the transistor 116 described in association with FIG. 1. As shown metallization structure 142 is coupled with the transistor 104. Metallization structure 142 is formed in a dielectric 144 above the transistor 104.

Figure 3B:
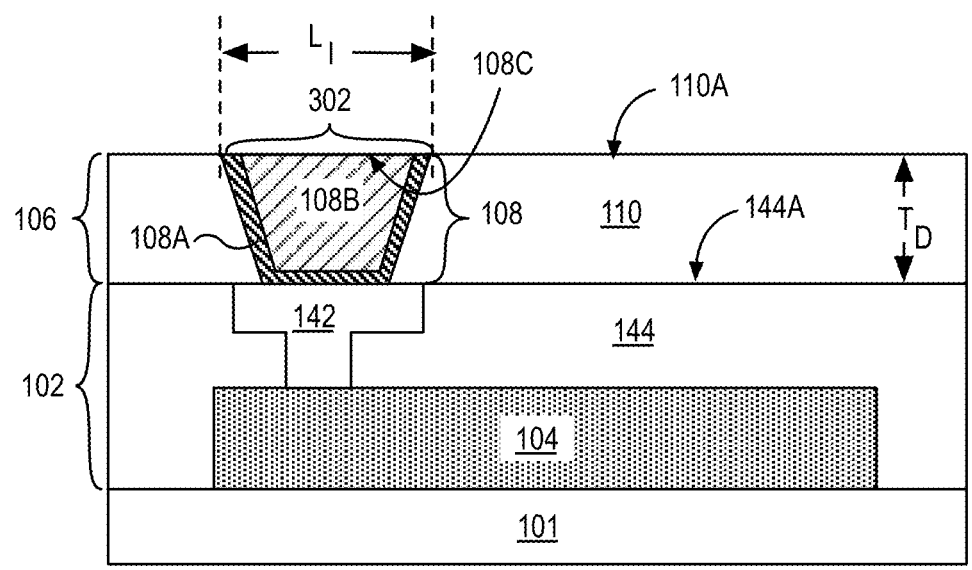
FIG. 3B is a cross-sectional illustration of the structure in FIG. 3A following the formation of an interconnect structure coupled with the metallization structure, in accordance with an embodiment of the present disclosure.

FIG. 3B is a cross-sectional illustration of the structure in FIG. 3A following the formation of interconnect structure 108 above device level 102. As shown, interconnect structure 108 is formed by depositing a dielectric 110 on the metallization structure 142 and on dielectric 144. In an embodiment, the dielectric 110 is blanket deposited on the metallization structure 142 by a (PECVD) or a chemical vapor deposition (CVD) process. In embodiments, the dielectric 110 is deposited to a thickness, TD, between 10 nm and 100 nm. In the illustrative embodiment, $T_D$, is also representative of a height of the interconnect structure 108, relative to uppermost surface 144A. A thickness, $T_D$, between 10 nm and 100 nm is sufficient to ensure that interconnect structure 108 is formed on the metallization structure 142, with a low probability of misalignment.

In an embodiment, a plasma etch process is utilized to form an opening 302 in the dielectric 110 to expose the metallization structure 142. A conductive material is deposited into the opening 302 on the metallization structure 142 and on uppermost surface 110A of dielectric 110. The conductive material is chosen to have favorable silicon/germanide formation characteristics. In embodiments, the conductive material is dependent on whether a silicide or a germanide is to be formed above the interconnect structure 108. Examples of conductive material that favor silicide formation include metals, such as but not limited to, titanium, cobalt, nickel, tungsten and platinum and examples of metals favorable for germanide formation include titanium, cobalt, nickel, tungsten, platinum, and rare earth metals such as Nd, Sm, Gd, Tb, Dy and Ho. In some embodiments, interconnect structure 108 includes a liner 108A adjacent to the dielectric, and a fill metal 108B within the liner. In an embodiment, the liner 108A includes Ru, Ti, Co, Ta, or nitrides of Ti or Ta. In embodiments, the conductive material is planarized and removed from uppermost surface 110A to form interconnect structure 108. In an embodiment, a chemical mechanical polish process is utilized to planarize the conductive material. In an exemplary embodiment, an uppermost surface 108C of the interconnect structure 108 and uppermost surface 110A are co-planar or substantially co-planar. Co-planar surfaces are highly desirable to minimize defects during a wafer bonding process, to be carried out in a subsequent operation.

Figure 4:
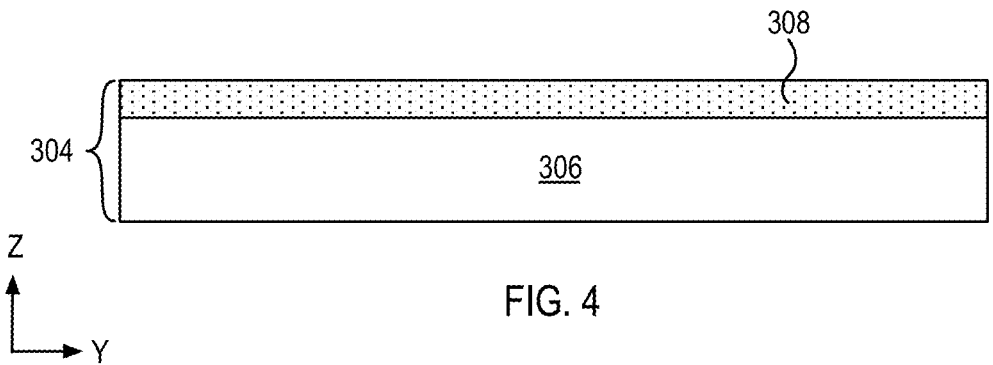
FIG. 4 is a cross-sectional illustration of a second wafer including a second substrate and a first bonding layer formed on the second substrate.

FIG. 4 is a cross-sectional illustration of a wafer 304 including a substrate 306 and a bonding layer 308 formed on the substrate 306. In an embodiment, the substrate 306 includes a material that is utilized as a channel layer for a transistor. In exemplary embodiments, substrate 306 includes monocrystalline silicon, Si-Ge, or germanium. The choice of material for the bonding layer 308 is based on favorability to form a silicide or a germanide and be selectively removable with respect to the material of the substrate 306. In some embodiments, the material of the bonding layer 308 includes amorphous silicon or germanium. In exemplary embodiments, bonding layer 308 includes a material such as amorphous silicon or germanium but be different from a material of the substrate 306. The bonding layer 308 may be sputter deposited on to the substrate 306 by a PVD process. In some embodiments, the bonding layer 308 is deposited to a thickness of at least 1 nm but can be as thick as 3 nm.

Figure 5A:
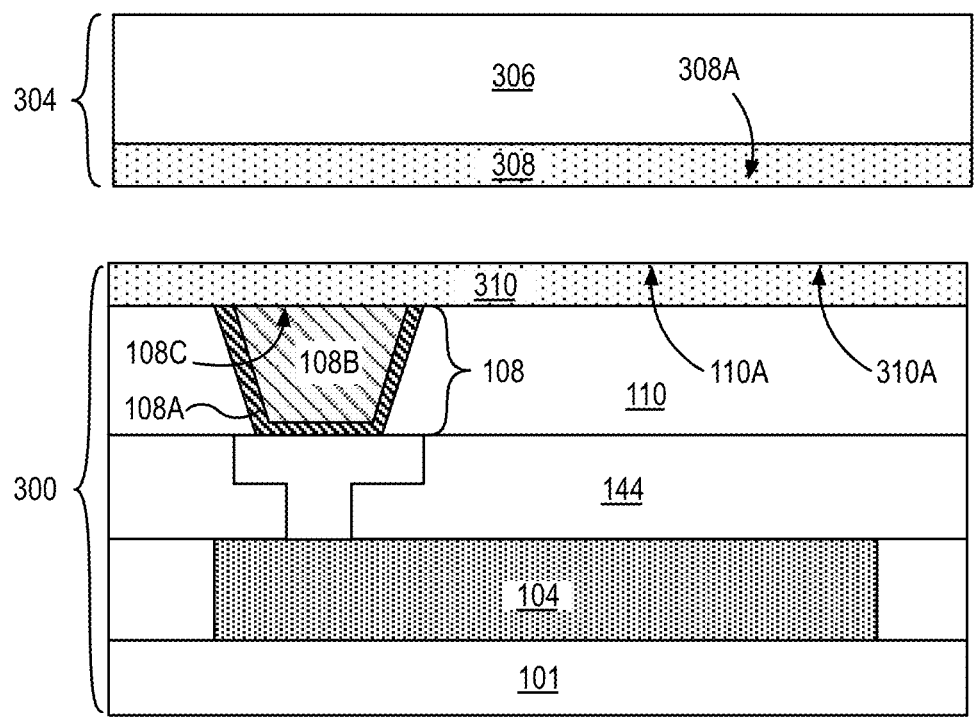
FIG. 5A is a cross-sectional illustration of the structure in FIG. 3B following the process to form a second bonding layer on the first substrate.

FIG. 5A is a cross-sectional illustration of the structure in FIG. 3B following the process to form a bonding layer 310 on an uppermost surface 108C and on dielectric 110A. In an embodiment, the bonding layer 310 includes a material that is the same or substantially the same as the material of the bonding layer 308. The bonding layer 310 is designed to form a germanide or a silicide on the uppermost surface 108C but not on the uppermost surface 110A of the dielectric 110.

After deposition of bonding layers 308 and 310, a surface activation process is performed on each of the bonding layers 308 and 310. Activation of the bonding layer surfaces 308A and 310A may be achieved by a variety of chemical methods and is characterized by an increase in bonding energy between bonding layer surfaces 308A and 310A. One method of activation may be to modify the bonding layer surfaces 308A and 310A with functional groups that have a strong binding energy. In an embodiment, the chemical treatment includes plasma activation of the surfaces 308A and 310A to increase binding energy. The surfaces 308A and 310A can be made more hydrophilic, or hydrophobic to increase an interfacial adhesion of amorphous silicon, or Ge in each of the bonding layers 308 and 310.

Figure 5B:
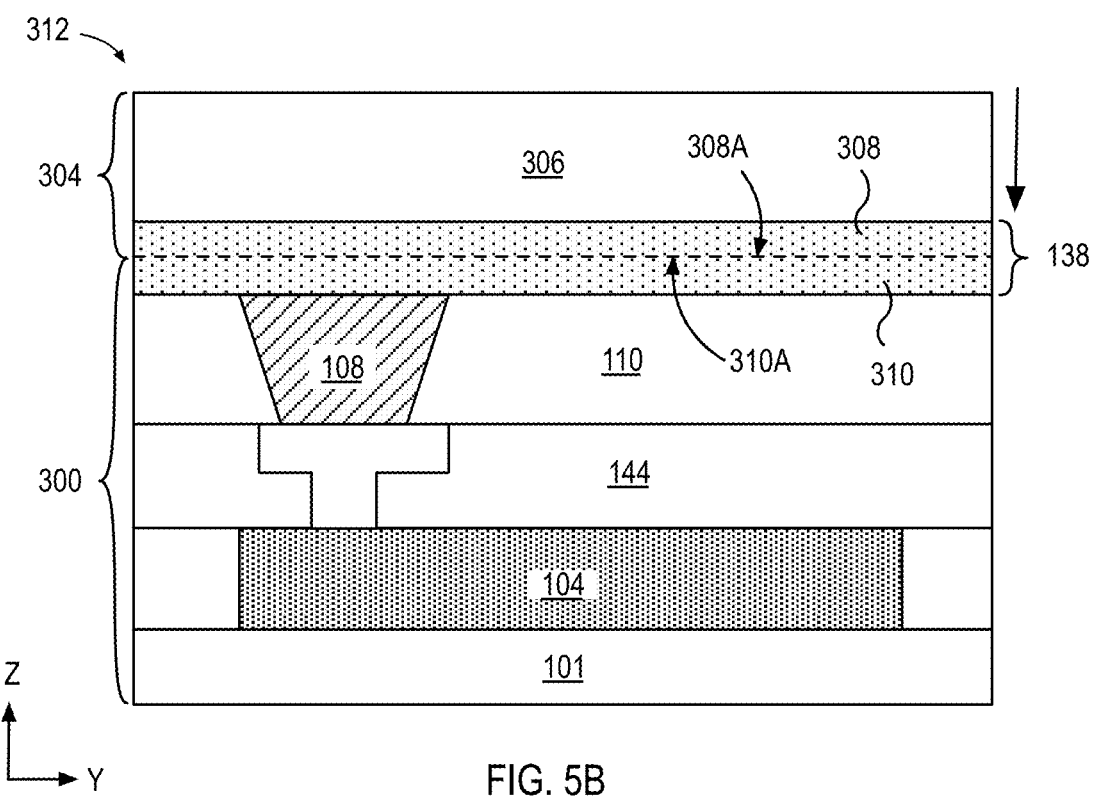
FIG. 5B illustrates a cross-sectional view of the structure of FIG. 5A following the process to bond the first wafer to the second wafer to form a bonded wafer, in accordance with an embodiment of the present disclosure.

FIG. 5B illustrates a cross-sectional view of the structure of FIG. 5A following the process to bond a wafer 304 on to wafer 300 to form a bonded wafer 312, in accordance with an embodiment of the present disclosure. In an embodiment, surfaces 308A and 310A are brought into contact with each other and process of direct wafer bonding is performed in a wafer bonding apparatus. In an embodiment, after plasma activation of each surface 308A and 310A, the wafers 300 and 304 are bonded in a high vacuum environment to prevent oxidation.

In exemplary embodiments, the individual bonding layers 308 and 310 are indistinguishable after the bonding process to form a substantially uniform bonding layer 138. It is to be appreciated that the material of the bonding layer 138 is different from a material of the substrate 306 to permit removal of the portions of the bonding layer 138 in a downstream process.

Figure 5C:
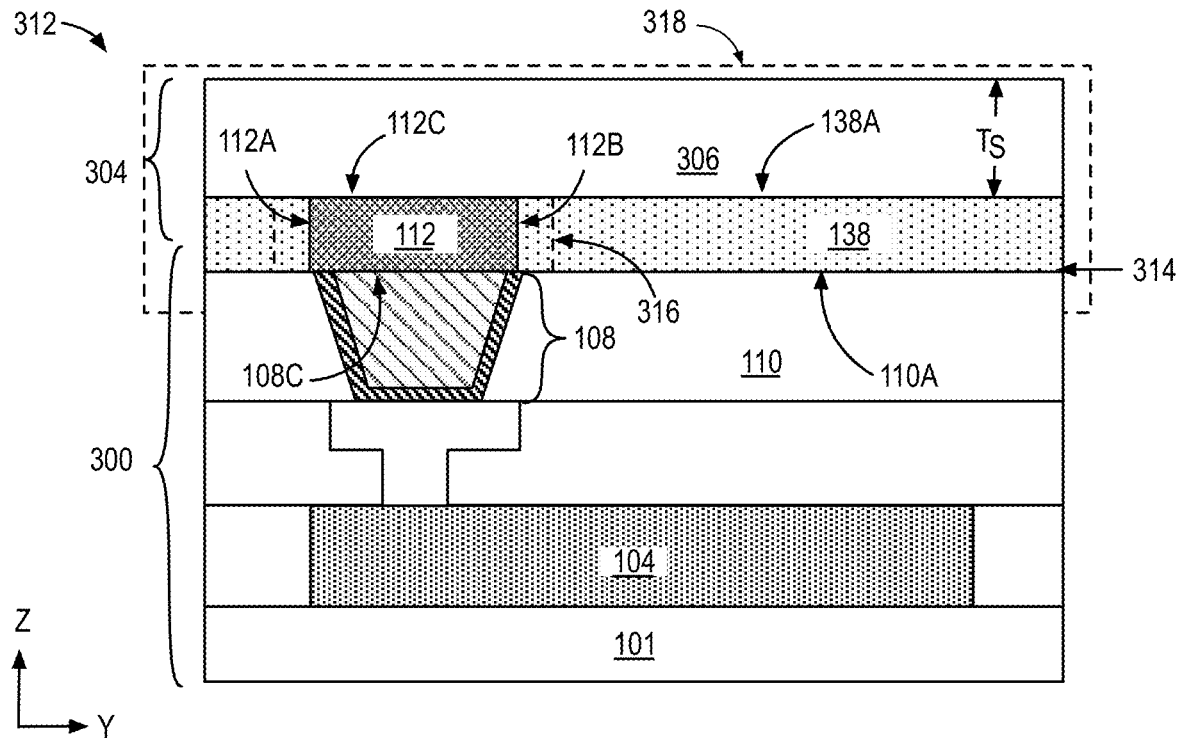
FIG. 5C is a cross-sectional illustration of the bonded wafer 312 in FIG. 5B following the process to form a cap structure over the interconnect structure, within the bonding layer.

FIG. 5C is a cross-sectional illustration of the bonded wafer 312 in FIG. 5B following the process to form a cap structure 112 over interconnect structure 108. The cap structure 112 results from a process to form a silicide or a germanide within a portion of the bonding layer 138. In an embodiment, the bonded wafer 312 is heated in a furnace. The one or more metals in the interconnect structure 108 react with the silicon or germanium in bonding layer 138. In exemplary embodiments, the reaction begins at an interface 314, between bonding layer 138 and interconnect structure 108 and proceeds to portions of the bonding layer 138 directly above the interconnect structure 108. Diffusion of the one or more metals from interconnect structure 108 and reaction with the material of bonding layer 138 forms a cap structure 112. Because the formation process is dependent on reaction between the one or more metals in an uppermost surface 108C of the interconnect structure 108 and the bonding layer 138 at interface 314, the cap structure 112 formed is self-aligned with the interconnect structure 108. As such, the cap structure 112 has a substantially same surface area and shape as a surface area and shape of the interconnect structure 108 at interface 314. The process requires no additional lithographic operations to form a cap structure 112 with a plan view shape of uppermost surface 108C of interconnect structure 108. It is to be appreciated that the one or more metals in the interconnect structure 108 do not react with the dielectric 110.

The formation process can be controlled to limit the diffusion of the metal from the interconnect structure 108. In some embodiments, the reaction process converts a portion of the bonding layer 138 that is immediately above the interconnect structure 108 into a silicide or a germanide depending on the material of the bonding layer 138. In exemplary embodiments, the cap structure 112 does not extend laterally beyond a perimeter of the uppermost surface 108C as shown. In other embodiments, sidewalls 112A and 112B of the cap structure 112 can extend beyond the perimeter of the uppermost surface 108C if metal from the interconnect structure 108 diffuses laterally beyond the uppermost surface 108C as indicated by dashed box 318. In embodiments, the lateral diffusion is no more than 2 nm. In the illustrative embodiment, because cap structure 112 is formed from a conversion of the bonding layer 138, uppermost surface 112C of the cap structure 112 is co-planar or substantially co-planar with uppermost surface 138A.

Formation of a silicide or a germanide cap structure 112, through a process of bonding and conversion, is favorable over an alternative process of bonding wafer 312. In embodiments, the alternate process includes bonding an interconnect structure 108 adjacent to a dielectric directly with an amorphous silicon, or germanium formed on substrate 306 for example. However, bonding a metallic uppermost surface 108C of interconnect structure 108 to a silicon or germanium material can lead to defects in the vicinity of the metallic interconnect surface at interface 314. This problem may be further exacerbated if the uppermost surface 108C is not sufficiently coplanar with uppermost surface 110A.

To continue the fabrication process, the substrate 306 is thinned in a subsequent operation to form, source drain and channel regions of a transistor, for example. The substrate 306 is thinned down to desired substrate thickness, $T_S$, as measured from an uppermost surface 138A of bonding layer 138. In embodiments, $T_S$, is between 10 nm and 50 nm. In exemplary embodiments, the substrate 306 is thinned down from an original thickness to $T_S$, to minimize electrical resistance through the interconnect structure 108. In an embodiment, the substrate 306 is thinned by a CMP process, a wet etch, a dry etch, a combination thereof.

The bonded wafer 312 undergoes a sequence of processing operations as outlined below to form a transistor, such as transistor 100.

Figure 6:
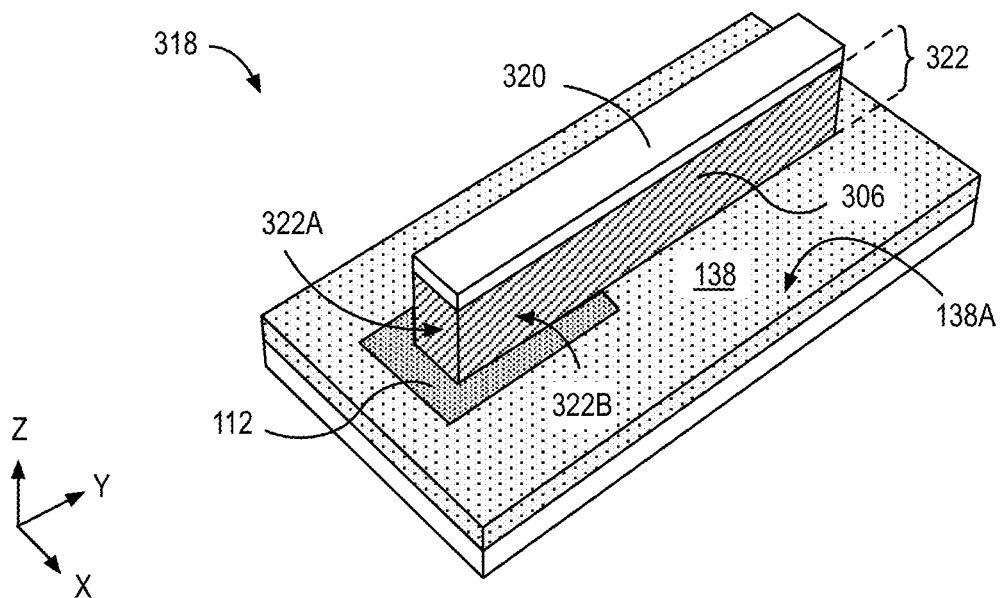
FIG. 6 is an isometric illustration of a portion of the structure in FIG. 5C following the process to pattern the second substrate to for a fin structure.

FIG. 6 is an isometric illustration of a portion 318 of the structure in FIG. 5C following the process to pattern the substrate 306. In an embodiment, a mask 320 is formed on the substrate 306. The mask 320 may be patterned to form a desired shape of a device to be fabricated. In an embodiment, a plasma etch process is utilized to pattern the substrate 306 selectively to the mask 320 to form a fin structure 322. The fin structure 322 has one or more features of the channel layer 118 described in association with FIG. 1. In the illustrative embodiment, the fin structure 322 may have a shape and size that is chosen to form a planar, non-planar or a nano-wire transistor.

In the illustrative embodiment, the fin structure 322 is utilized to fabricate a non-planar transistor. As shown, the patterning process, to form fin structure 322, is stopped after the formation of the fin structure 322 and after bonding layer 138 is exposed.

The fin structure 322 is aligned with the cap structure 112 so that one end of the fin structure 322 is directly above the cap structure 112. Depending on a relative shape and size of the cap structure 112 and the fin structure 322, the cap structure 112 may be exposed. In the illustrative embodiment, the cap structure 112, extends beyond fin sidewalls 322A and 322B, and because uppermost surface 112C of substantially co-planar with uppermost surface 138A, the cap structure 112 is also exposed after patterning the substrate 306.

As shown, the cap structure 112 has a rectangular shape. In other embodiments, the cap structure 112 may be oval or circularly shaped. In other embodiments, the cap structure 112 is a line structure that intersects with the fin structure 322, but is directed orthogonal (x-direction) to the fin structure.

Figure 7A:
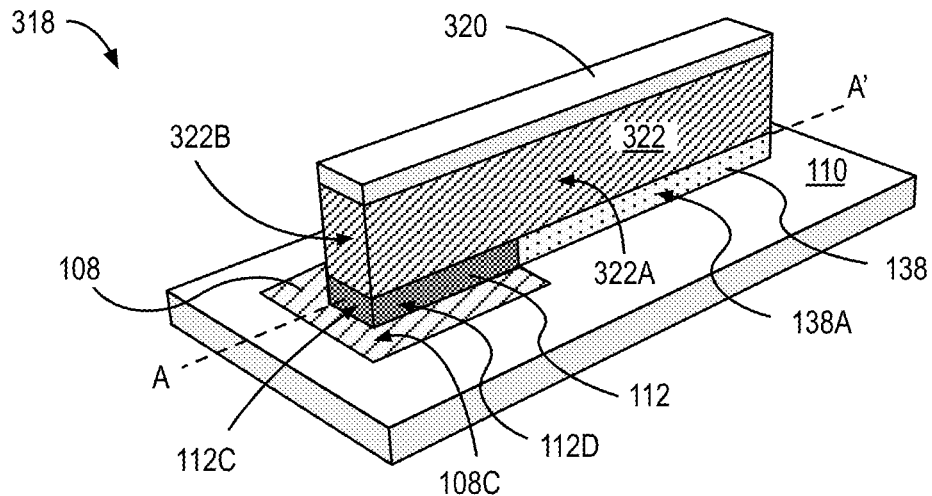
FIG. 7A is a cross-sectional illustration of the structure in FIG. 6 following the process to etch the bonding layer.

FIG. 7A is a cross-sectional illustration of the structure in FIG. 6 following the process to etch bonding layer 138. In an embodiment, the plasma etch process utilized to form fin structure 322 is extended to etch and remove bonding layer 138 not covered by mask 320 (or the fin structure 322). The plasma etch process is stopped after bonding layer 138 is etched and dielectric 110 is exposed. As shown, the plasma etch process utilized forms sidewalls of bonding layer 138 that are substantially coplanar with sidewall 322A of the fin structure 322. In the illustrative embodiment, bonding layer 138 has three sidewalls that are co-planar or substantially co-planar with sidewalls of the fin structure 322.

As discussed above, the cap structure 112 may extend beyond sidewalls of the fin structure, as shown in FIG. 6. Referring again to FIG. 7A, because the cap structure 112 has a shape and size that is comparable to uppermost surface 108C of the interconnect structure 108, after etching the cap structure 112, interconnect structure 108 may be exposed as shown. The plasma etch process substantially transfers the shape of the mask 320 to portions of the cap structure 112. In the illustrative embodiment, portions of the cap structure 112 not covered by the mask 320 are etched along with bonding layer 138. The etch process forms a cap structure 112 having one or more sidewalls that substantially that are co-planar or substantially co-planar with sidewalls of the fin structure 322. In the illustrative embodiment, cap structure 112 has three sidewalls that are co-planar or substantially co-planar with sidewalls of the fin structure 322. As shown, cap structure sidewalls 112C and 112D are substantially co-planar with fin sidewalls 322B and 322A, respectively (a third pair of co-planar sidewalls is not visible in the isometric illustration).

It is favorable for the cap structure 112 to be in contact with as much of a lowermost surface (of a source or a drain region to be formed) of the fin structure 322, to minimize electrical resistance between the source or the drain region and the interconnect structure 108. However, it is to be appreciated that the shape of the cap structure 112 is determined by an overlap between a plan view shape of uppermost surface 108C and a plan view shape of the fin structure 322. The resulting shape and placement of the cap structure 112 relative to the fin structure 322 also depends on alignment between the mask 320 and the interconnect structure 108. Various embodiments depicting relative shapes and sizes of the interconnect structure 108, fin structure 322 and the resulting cap structure 112 are illustrated in FIG. 7B-D.

Figure 7B:
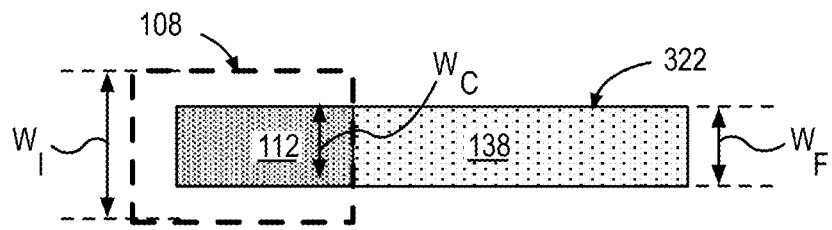
FIG. 7B is a plan view illustration, through a line A-A' of the structure in FIG. 7A, in accordance with an embodiment of the present disclosure.

FIG. 7B is a plan view illustration, through a line A-A' of the structure 318 in FIG. 7A. An outline of the interconnect structure 108 (in dashed lines) is illustrated to depict a shape and size of the interconnect structure 108, as well as indicate relative alignment between the fin structure 322 (not in the plane of the Figure but indicated by an arrow 322) and the interconnect structure 108. In the illustrative embodiment, the interconnect structure 108 has a rectangular shape and a width, $W_I$, that is greater the width, $W_F$, of the fin structure 322. As shown, fin structure 322 is substantially aligned with the interconnect structure 108. As such, the cap structure 112 has a shape as is depicted in FIG. 7B. In some such embodiments, cap structure 112 has a width, $W_C$, that is substantially the same as either $W_F$. As shown cap structure 112 has three sidewalls that are co-planar or substantially co-planar with sidewalls of the fin structure 322.

Figure 7C:
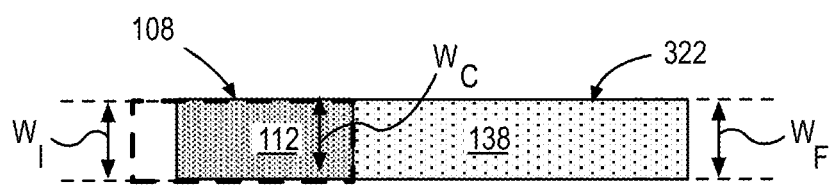
FIG. 7C is a plan view illustration, through a line A-A' of the structure in FIG. 7A, in accordance with an embodiment of the present disclosure.

FIG. 7C is a plan view illustration, through a line A-A' of the structure 318 in FIG. 7A, in accordance with an embodiment of the present disclosure. In the illustrative embodiment, the interconnect structure 108 has a rectangular shape and a width, $W_I$, that is the same or substantially the same as the width, $W_F$, of the fin structure 322. As shown, fin structure 322 is substantially aligned with the interconnect structure 108. As such, the cap structure 112 has a shape as is depicted in the Figure. In some such embodiments, cap structure 112 has a width, $W_C$, that is substantially the same as either $W_F$ or $W_I$.

Figure 7D:
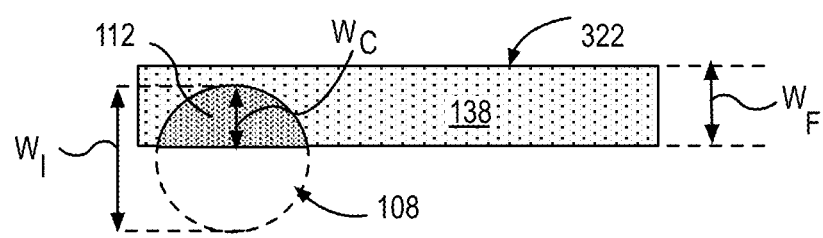
FIG. 7D is a plan view illustration, through a line A-A' of the structure in FIG. 7A, in accordance with an embodiment of the present disclosure.

FIG. 7D is a plan view illustration, through a line A-A' of the structure 318 in FIG. 7A, in accordance with an embodiment of the present disclosure. As shown, interconnect structure 108 has a plan view profile that is circular and has a diameter, $W_I$, that is greater than $W_F$. However, in the illustrative embodiment, the fin structure 322 is misaligned with the interconnect structure 108. In some such embodiments, the cap structure 112 has a width, $W_C$, that is less than $W_F$, and does not extend along a full width of the fin structure 322. In the illustrative embodiment, the cap structure 112 has one sidewall that is co-planar or substantially coplanar with the fin structure 322. As such cap structure 112 has an asymmetric plan view shape along the width of the fin structure 322.

Figure 8A:
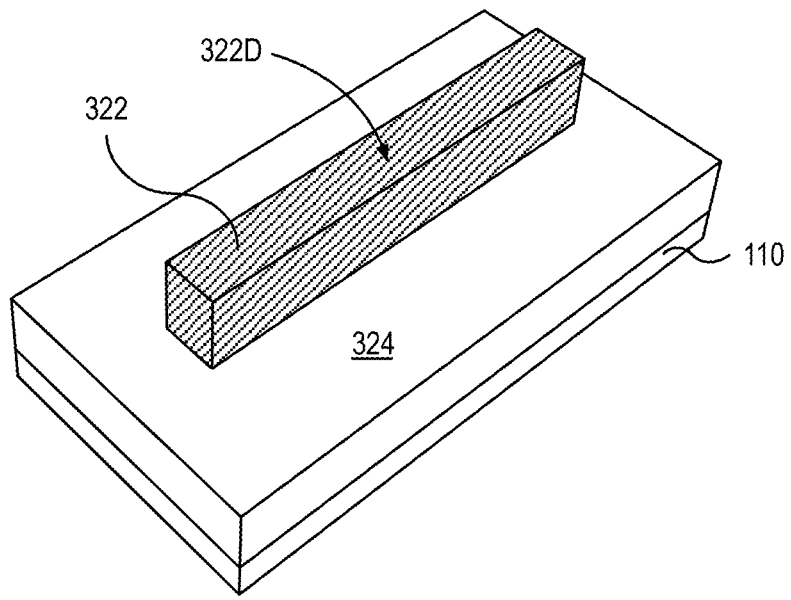
FIG. 8A is an isometric illustration of the structure in FIG. 7A following a process to form a dielectric adjacent to the fin structure.

FIG. 8A is an isometric illustration of the structure in FIG. 7A following a process to form a dielectric 324 adjacent to the fin structure 322, in accordance with an embodiment of the present disclosure. In an embodiment, the dielectric 324 is deposited by a blanket deposited on the fin structure 322, using a physical vapor deposition (PVD) or a chemical vapor deposition (CVD) process. In an embodiment, a chemical mechanical polish (CMP) process is utilized to planarize the dielectric 324. In an embodiment, the CMP process removes the mask 320 (not shown). After planarization, the dielectric 324 may be recessed relative to an uppermost surface 322D of the fin structure 322. Formation of a recessed dielectric 324 relative to uppermost surface 322D facilitates formation of a non-planar transistor. The amount of recess depends on a desired fin height. In an embodiment, the dielectric 324 includes silicon and one of more of oxygen, nitrogen or carbon.

Figure 8B:
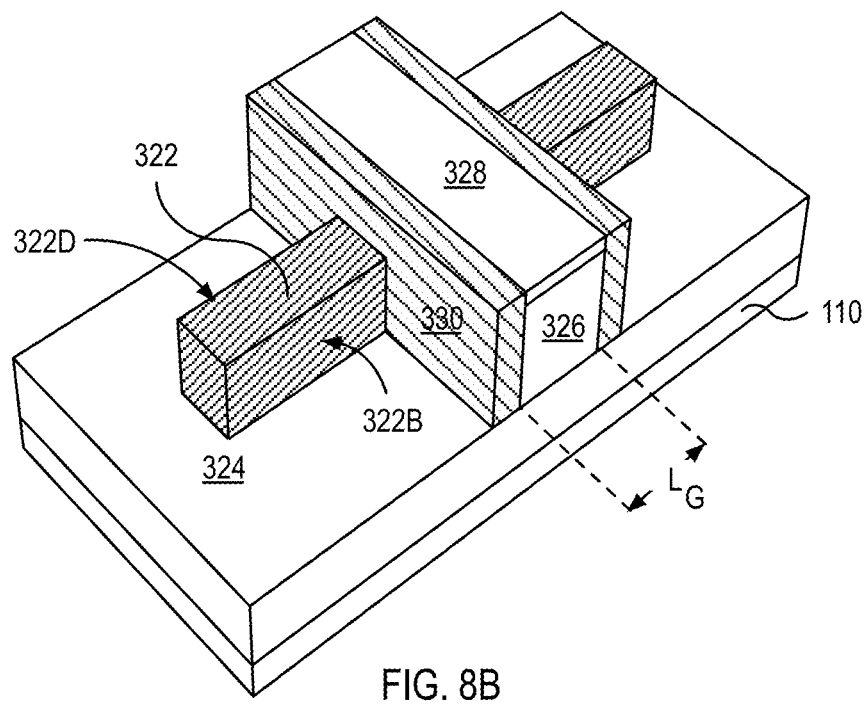
FIG. 8B is a cross-sectional illustration of the structure in FIG. 8A following the formation of a dummy gate structure, and a spacer adjacent to the dummy gate structure on a portion of the fin structure.

FIG. 8B is a cross-sectional illustration of the structure in FIG. 8A following the formation of a dummy gate structure 326 on a portion of the fin structure 322. In an embodiment, a dummy gate material is blanket deposited on the fin structure 322 and on the dielectric 324. In an embodiment, a mask 328 is formed on the dummy gate material and a plasma etch process is utilized to pattern the dummy gate material into dummy gate structure 326, as shown. In an exemplary embodiment, a gummy gate dielectric layer (not shown) is blanket deposited on the dielectric 324 and on the fin structure 322 prior to deposition of the dummy gate material. In an embodiment, a mask 328 is formed on the dummy gate material and a plasma etch process is utilized to pattern the dummy gate material into a dummy gate structure 326, as shown. The dummy gate structure 326 has a lateral width, $L_G$. $L_G$ defines a width of a transistor gate that is to be formed. In an embodiment, the dummy gate structure 326 includes a material such as polysilicon, silicon germanium or germanium, and a combination of plasma etch, and wet chemical etch can be utilized to pattern the dummy gate structure 326.

After formation of the dummy gate structure 326, a dielectric spacer 330 is formed adjacent to the dummy gate structure 326. In an embodiment, a dielectric spacer layer is blanket deposited on the fin structure 322, on dielectric 324, and on the dummy gate structure 326. The deposition process utilized may include a PECVD (plasma enhanced chemical vapor deposition), physical vapor deposition (PVD), chemical vapor deposition (CVD) process. In an embodiment, the dielectric spacer layer includes silicon and nitrogen and/or carbon. The dielectric spacer layer is etched to form dielectric spacer 330. A plasma etch may be utilized to pattern the dielectric spacer 330. An over etch of the dielectric spacer layer is carried out to remove the dielectric spacer layer from sidewall portions of the fin structure 322. In the illustrative embodiment, the etch is selective to the fin structure 322. In the illustrative embodiment, the dielectric spacer 330 is formed on sidewall portions of the fin structure 322 directly adjacent to the dummy gate structure 326. As shown, the dummy gate structure 326 and the dielectric spacer 330 both cover portions of the sidewalls 322B and 322D of the fin structure 322.

The dielectric spacer 330 may be formed to a thickness that is determined by downstream process, electrical performance (such as modulating external resistance, capacitance) or a combination thereof. In an embodiment, the dielectric spacer 330 has a lateral width between 3 nm to 10 nm.

Figure 8C:
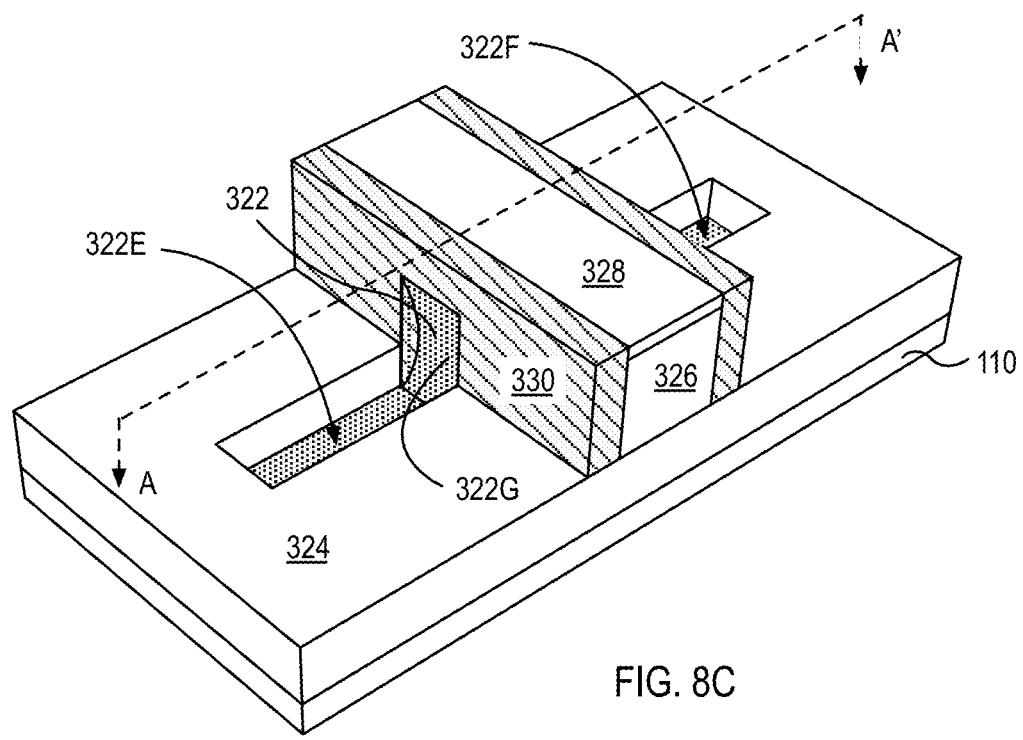
FIG. 8C is a cross-sectional illustration of the structure in FIG. 8B following the process to recess portions of the fin structure not covered by the spacer.

FIG. 8C is a cross-sectional illustration of the structure in FIG. 8B following the process to recess portions of the fin structure 322 not covered by the dielectric spacer 330. In an embodiment, the fin structure 322 is etched by a plasma etch process. In an embodiment, the plasma etch process forms recessed fin portions 322E and 322F. A portion 322G of the fin structure 322 remains under the dielectric spacer 330, and the dummy gate structure 326. Fin portion 322G is adjacent to recessed fin portions 322E and 322F, and is collectively representative of channel layer 118, described in association with FIG. 1, in accordance with an embodiment of the present disclosure. In some embodiments the plasma etch process etches all of the fin structure 322 except for fin portion 322G. In one such embodiment, the cap structure 112 is exposed (not shown).

Figures 9A, 9B:
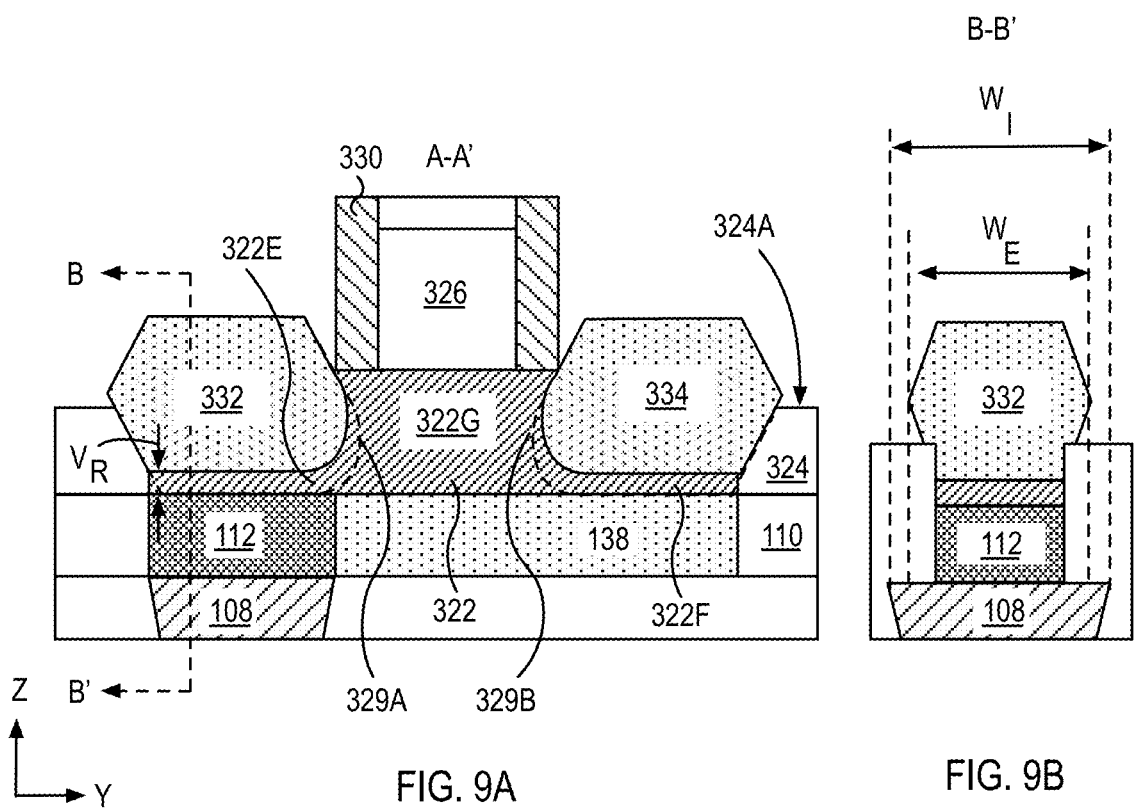
FIG. 9A is a cross-sectional illustration, through the line A-A', of the structure in FIG. 8C, following the formation of epitaxial source structure and epitaxial drain structure on the recessed fin portions.
FIG. 9B is a cross-sectional illustration, through a line B-B' of the structure in FIG. 9A.

FIG. 9A is a cross-sectional illustration, through the line A-A', of the structure in FIG. 8C, following the formation of epitaxial source structure 332 and epitaxial drain structure 334 on the recessed fin portions 322E and 322F. In some exemplary embodiments, epitaxial source structure 332 and epitaxial drain structure 334 are grown from the surface of the fin portions 322E and 322F and off sidewall of fin portion 322G. In an embodiment, the epitaxial source structure 332 and epitaxial drain structure 334 include a material that is the same or substantially the same as the material of the epitaxial source structure 126 and epitaxial drain structure 128, described in association with FIG. 1.

In an embodiment, the fin portions 322E and 322F are heavily doped with n+ or p+ dopant species prior to formation of epitaxial source structure 332 and epitaxial drain structure. n+ or p+ dopants can appreciably minimize electrical resistance between the epitaxial source structure 332 and epitaxial drain structure 334 and the interconnect structure 108. In the illustrative embodiment, the epitaxial source structure 332 and epitaxial drain structure 334 grow adjacent to the dielectric spacer 330, above the dielectric surface 324A. In exemplary embodiments, fin portions 322E and 322F have a vertical thickness, $V_R$, as measured from an uppermost surface of the cap structure 112, that is between 5 nm and 20 nm. $Y_R$ depends on a total thickness of the fin structure 322 and is sufficiently thin to be doped.

In other embodiments, the recessed fin portions 322E and 322F are completely etched to expose cap structure 112 and bonding layer. In some such embodiments, epitaxial source structure 332 and epitaxial drain structure 334 are directly adjacent to cap structure 112 and bonding layer, respectively, as illustrated by dashed lines 329A and 329B.

FIG. 9B is a cross-sectional illustration, through a line B-B' of the structure in FIG. 9A. In the illustrative embodiment, the cap structure 112 extends a full width $W_F$ of the fin portion 322E, and the interconnect structure 108 is wider than $W_F$. As shown, epitaxial source structure 332 has a width, $W_E$, that is greater than $W_F$ but less than $W_I$. In other embodiments, $W_I$ is less than $W_E$.

Figure 10:
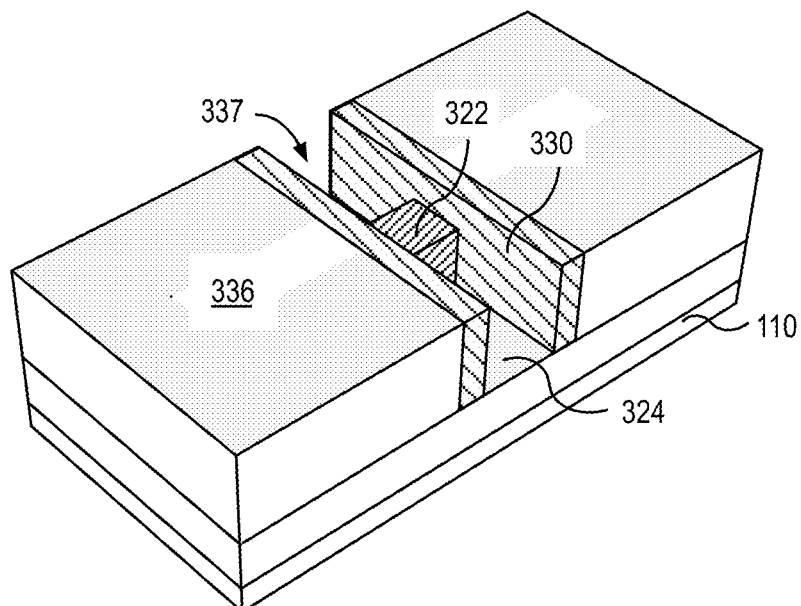
FIG. 10 is an isometric illustration of the structure in FIG. 9A following the process to remove the dummy gate structure.

FIG. 10 is an isometric illustration of the structure in FIG. 9A following the process to remove the dummy gate structure 326. In an embodiment, a dielectric 336 is deposited on the epitaxial source structure 332, on epitaxial drain structure 334, on the dielectric 324, adjacent to and on dielectric spacer 330, and on mask 328 (not shown). In an embodiment, the dielectric 336 includes a material that is the same or substantially the same as the dielectric 324 and is blanket deposited by a CVD or PECVD deposition process. In an embodiment, the dielectric 336 is planarized by a CMP process. In the illustrative embodiment, the hardmask is also removed during the CMP process and the dummy gate structure is exposed. The dummy gate structure (not shown) is subsequently removed by a wet chemical process selectively to the dielectric 336 and dielectric spacer 330 and to a sacrificial gate dielectric layer formed prior to formation of the dummy gate structure. Removal of the dummy gate structure forms an opening 337.

Figure 11A:
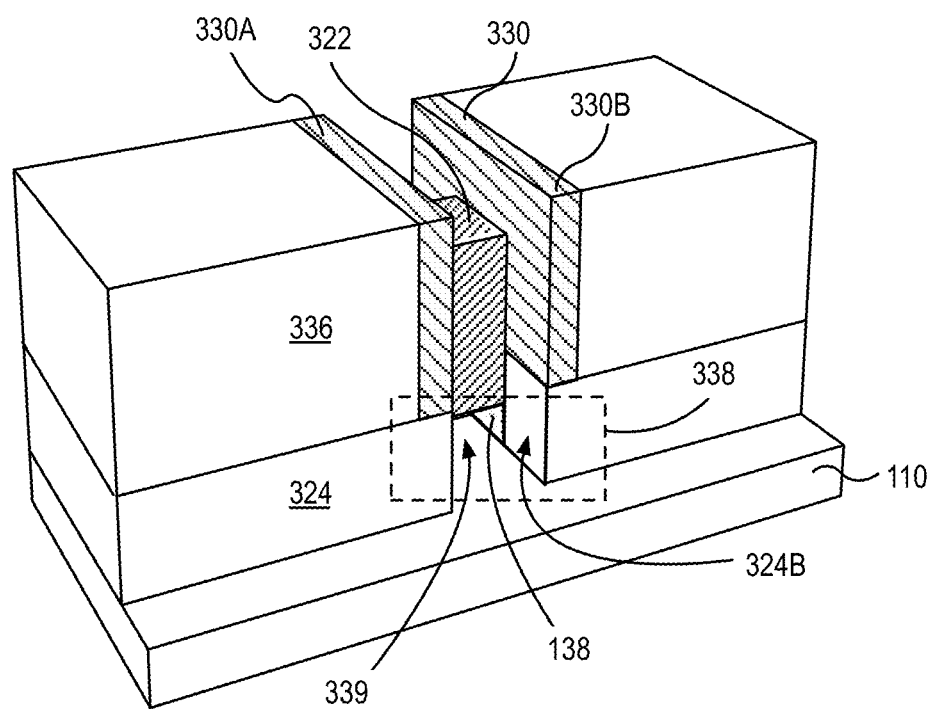
FIG. 11A is a cross-sectional illustration of the structure in FIG. 10 following the process to recess portion of the dielectric adjacent to the dielectric spacer and the fin structure and to etch a portion of the bonding layer under the fin structure in a channel region to form a cavity.

FIG. 11A is a cross-sectional illustration of the structure in FIG. 10 following the process to recess portion of the dielectric 324 adjacent to the dielectric spacer 330 and the fin structure 322. In the illustrative embodiment, the dielectric 324 is recessed by masking the dielectric spacer 330 and the dielectric 336 and using a plasma etch process to etch the dielectric 324. The plasma etch process may be halted after exposure of the dielectric 110.

After exposing a sidewall portion of the bonding layer 138, portion of bonding layer 138, under the fin structure 322 (and between the dielectric spacer portions 330A and 330B), is etched to form a cavity 339. In some embodiments, a wet chemical process, a plasma etch, or a combination thereof may be utilized to etch portions of bonding layer 138. In an embodiment, the wet chemical process selectively removes the material of bonding layer 138 with respect to fin structure 322, because of a difference in material between bonding layer 138 and fin structure 322. As shown, sidewall 324B of the dielectric 324, formed by the plasma etch process, that is adjacent to bonding layer 138 prevents bonding layer 138 from becoming recessed. However, it is to be appreciated, from discussions associated with FIG. 7B-D, that bonding layer 138 may also be adjacent to cap structure 112 even after forming the cavity 339. Furthermore, depending on embodiments, cap structure 112 and bonding layer 138 may be recessed under dielectric spacer portions 330A and 330B.

Figure 11B:
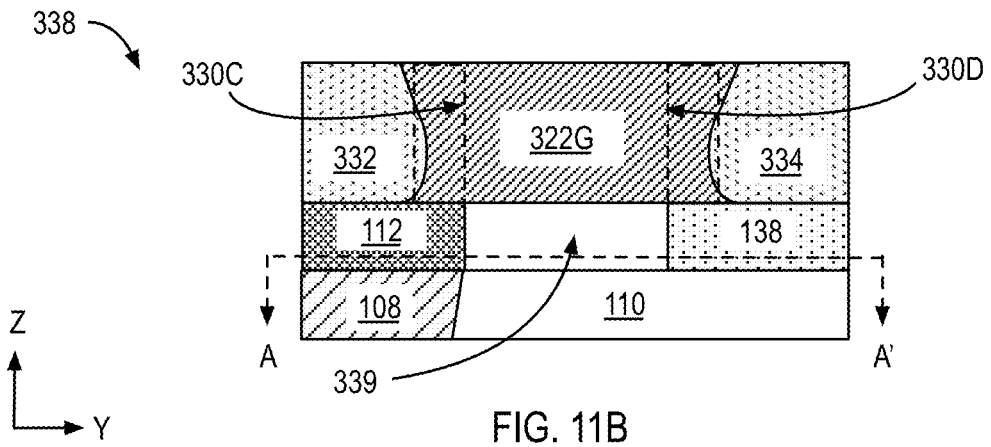
FIG. 11B is a cross-sectional illustration of a portion of the structure in FIG. 11A, in accordance with an embodiment of the present disclosure.

FIG. 11B is a cross-sectional illustration of a portion 338 of the structure in FIG. 11A, in accordance with an embodiment of the present disclosure. In the illustrative embodiment, features of the cavity 339 formed between fin structure 322 and dielectric 110, and between cap structure 112 and bonding layer 138 depends on the nature of the etch utilized and blocking sidewalls such as sidewall 324B (described in association with FIG. 11A). As shown, cap structure 112 extends to inner dielectric spacer sidewall 330C and bonding layer 138 extends to inner dielectric spacer sidewall 330D.

Figure 11C:
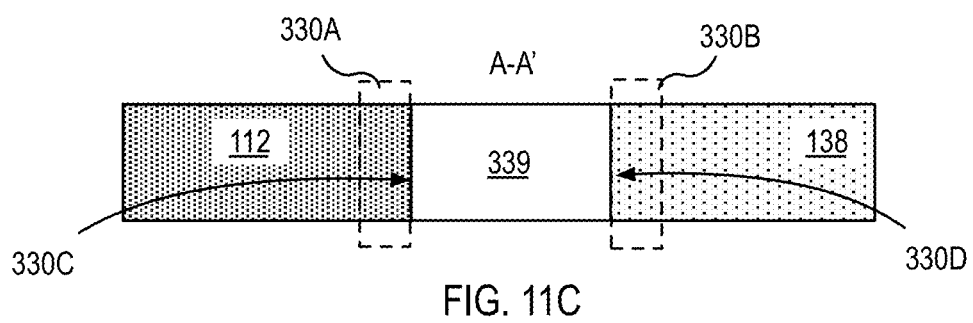
FIG. 11C is a plan-view illustration through a line A-A', of the structure in FIG. 11, in accordance with an embodiment of the present disclosure.

Plan-view illustrations in FIG. 11B-C are representative of some embodiments of the spatial extent of cap structure 112 and bonding layer 138. Outlines of dielectric spacer 330A portions and 330B and are illustrated to provide context of the size of the cavity 339. FIG. 11C is a plan-view illustration through a line A-A', of the structure in FIG. 11B. The cap structure 112 extends to an inner dielectric spacer dielectric sidewall 330C and bonding layer 138 extends to inner dielectric spacer sidewall 330D, as shown.

Figure 11D:
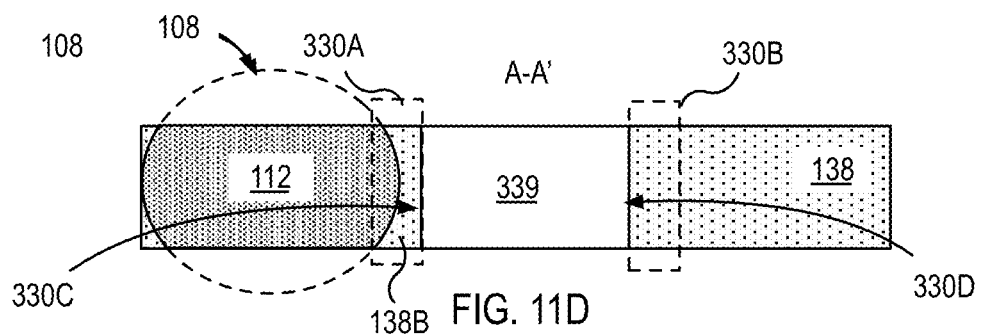
FIG. 11D is a plan-view illustration through a line A-A', of the structure in FIG. 11B in accordance with an embodiment of the present disclosure.

FIG. 11D is a plan-view illustration through a line A-A', of the structure in FIG. 11B, in accordance with an embodiment of the present disclosure. In the illustrative embodiment, a portion 138B of bonding layer 138 remains adjacent to cap structure 112 under dielectric spacer portion 330A, after formation of cavity 339. As shown, cap structure 112 extends under dielectric spacer portion 330A. In the illustrative embodiment, an outline of the interconnect structure 108 is indicated in dashed lines.

Figure 11E:
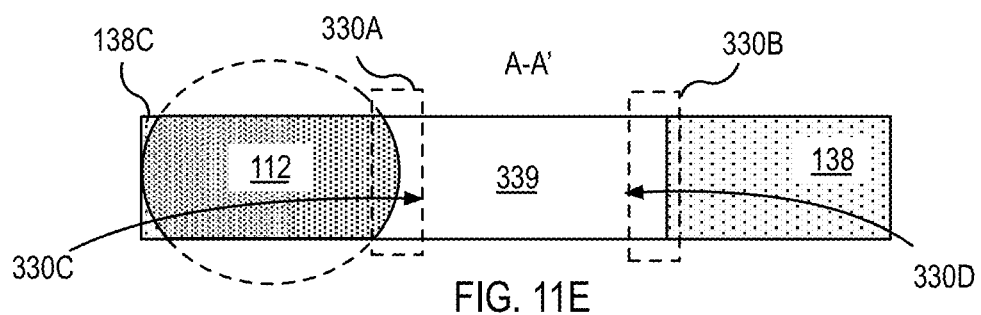
FIG. 11E is a plan-view illustration through a line A-A', of the structure in FIG. 11B in accordance with an embodiment of the present disclosure.

FIG. 11E is a plan-view illustration through a line A-A', of the structure in FIG. 11B, in accordance with an embodiment of the present disclosure. As shown, cap structure 112 extends under dielectric spacer portion 330A. In the illustrative embodiment, a portion of bonding layer 138 adjacent to cap structure 112 is removed while etching bonding layer 138 under the fin structure 322 (not shown in Figure). Cavity 339 is expanded compared to the cavity illustrated in FIG. 11D. In the illustrative embodiment, an outline of the interconnect structure 108 is indicated in dashed lines. It is to be appreciated that portions 138C of the bonding layer 138 may remain adjacent to one side of the cap structure 112, but not under the dielectric spacer portion 330A.

Figure 12:
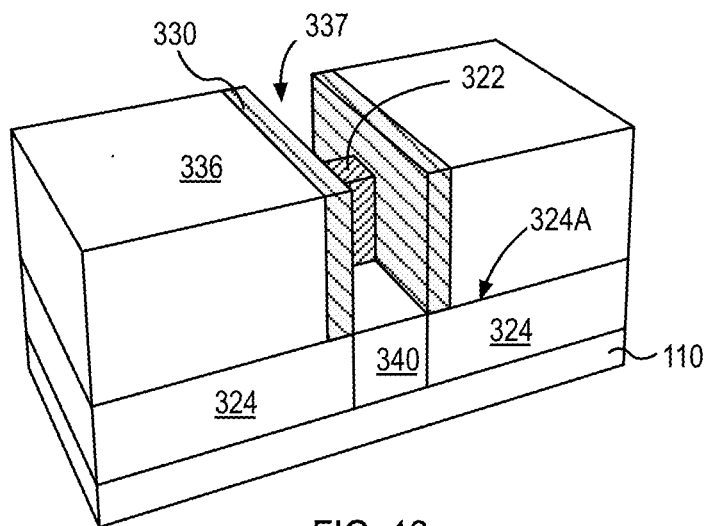
FIG. 12 is an isometric illustration of the structure in FIG. 11A following the process to fill a cavity formed after removing portions of the bonding layer under the channel region.

FIG. 12 is an isometric illustration of the structure in FIG. 11A following the process to fill the cavity 339 with dielectric 340 and following recessing of the dielectric 340 to a level of the uppermost surface 324A. In an embodiment, a dielectric 340 is blanket deposited using a CVD or a PECVD process on the fin structure 322 and on the dielectric 324 in the opening 337. The dielectric 340 fills the cavity 339 (hidden) and regions under the dielectric spacer 330 (if the cavity extends laterally). After deposition, the dielectric 340 is planarized and recessed by a wet chemical processing technique.

It is to be appreciated that in some embodiments, where the cavity 339 has a vertical thickness (along z-axis) of least 4 nm or more, a gate can be formed after formation of the cavity 339.

Figure 13A:
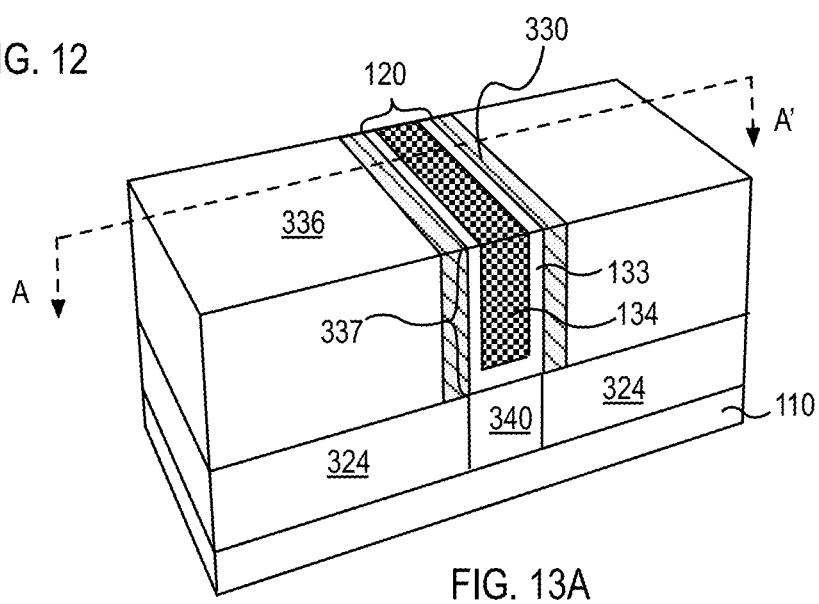
FIG. 13A is an isometric illustration of the structure in FIG. 12 following the process of forming the gate 120, in accordance with an embodiment of the present disclosure.

FIG. 13A is an isometric illustration of the structure in FIG. 12 following the process of forming the gate 120, in accordance with an embodiment of the present disclosure. In the illustrative embodiment, a gate dielectric layer 133 is blanket deposited on the fin structure 322 and on dielectric 340, adjacent to dielectric spacer 330 and on dielectric 336.

In embodiments, the gate dielectric layer 133 is an insulator having a high dielectric constant (such as a dielectric constant above 4). Examples of high dielectric constant materials that may be used in the gate dielectric layer 133 include hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

After formation of the gate dielectric layer 133, one or more layers of gate electrode material are blanket deposited in the opening 337, on the gate dielectric layer 133. Depending on whether a P-type or an N-type transistor is desired, gate electrode material includes a metal such as ruthenium, palladium, platinum, cobalt, nickel, hafnium, zirconium, titanium, tantalum, aluminum, alloys of these metals, and nitrides or carbides of ruthenium, palladium, platinum, cobalt, nickel, hafnium, zirconium, titanium, tantalum, aluminum such as hafnium nitride, zirconium nitride, titanium nitride, tantalum nitride, and aluminum nitride, or hafnium carbide, zirconium carbide, titanium carbide, tantalum carbide, or aluminum carbide. In some embodiments, the gate electrode material includes a work function layer suitable for an NMOS or a PMOS transistor and a fill metal on the work function layer.

After deposition, the one or more layers of gate electrode material and gate dielectric layer 133 may be planarized. In an embodiment, a chemical mechanical polish (CMP) planarization process is utilized to remove any excess gate electrode material and gate dielectric layer 133 from uppermost surfaces of the dielectric 336 and dielectric spacer 330. The planarization process forms a gate electrode 134.

Figure 13B:
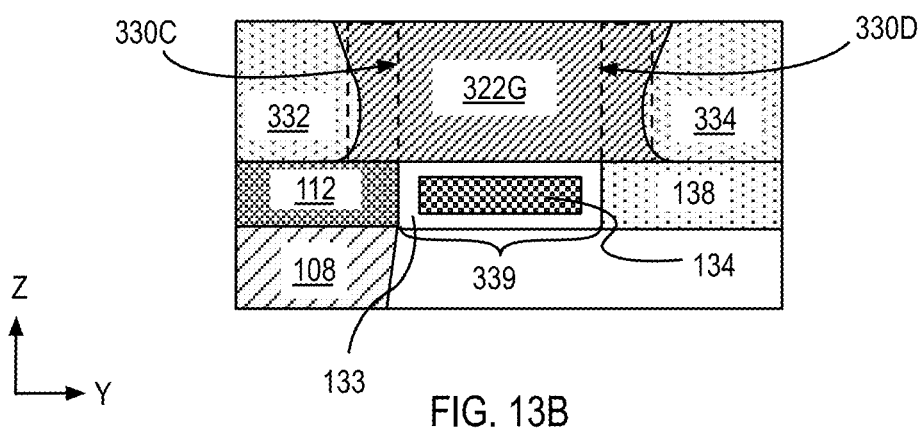
FIG. 13B is a cross-sectional illustration of a portion of the structure in FIG. 11A following the formation of a gate within the cavity.

In some embodiments, the dielectric 340 is not formed adjacent to dielectric 324, and a gate is formed adjacent to the fin structure illustrated in FIG. 11A. In some such embodiments, a gate, is formed in the cavity 339 adjacent to bonding layer bonding layer 138. FIG. 13B is a cross-sectional illustration of a portion 338 of the structure in FIG. 11A following the formation of a gate within the cavity 339. In an embodiment, a gate dielectric layer 133 is deposited by an atomic layer deposition process, adjacent to the cap structure 112 and bonding layer bonding layer 138, and under the fin portion 322G. In some such embodiments, a gate all around transistor may be formed. It is to be appreciated that a minimum cap structure 112 thickness of 3 nm may be required to successfully deposit a gate electrode material after depositing the gate dielectric layer 133 in the cavity 339. In embodiments, gate dielectric layer having a thickness of less than 1 nm can enable formation of a bottom gate under the fin portion 322G.

Figure 14A:
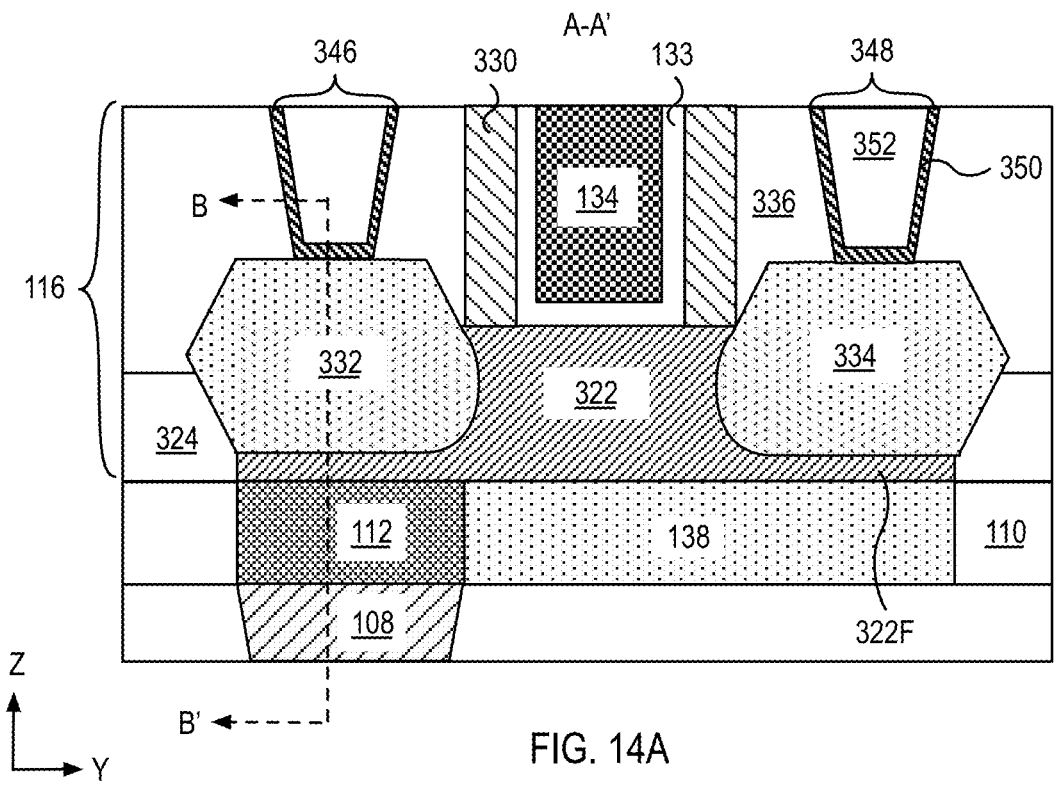
FIG. 14A is a cross-sectional illustration, through a line A-A', of the structure in FIG. 13A following the formation of metallization structures on each of the epitaxial source structure and on the epitaxial drain structure.

FIG. 14A is a cross-sectional illustration, through a line A-A', of the structure in FIG. 13A following the formation of metallization structures 346 and 348 on the epitaxial source structure 332 and epitaxial drain structure 334, respectively. In an embodiment, an opening is formed in the dielectric 336 over each of the epitaxial source structure 332 and epitaxial drain structure 334. In an embodiment, one or more layers of conductive material are blanket deposited in the openings on epitaxial source structure 332 and epitaxial drain structure 334.

In an embodiment, the conductive material includes one or more materials that are substantially the same as the material of the source contact 130 and drain contact 132 described in association with FIG. 1. In an embodiment, a liner layer 350 is deposited on the surface of the epitaxial source structure 332 and epitaxial drain structure 334. The liner layer 350 may include a conductive metal that does not diffuse into the neighboring dielectric 336 at process temperatures below 400 degrees Celsius. In an embodiment, the liner layer 350 includes Ru, TiN, TaN or Co. In some such embodiments, a conductive fill metal 352 is deposited on the liner layer 350. In an embodiment, the conductive fill metal 352 includes W, Cu, Mo or Co.

In an embodiment, a planarization process is utilized to remove the excess liner layer 350 and the fill metal formed above the on uppermost surface of the dielectric 336, dielectric spacer 330, gate dielectric layer 133 and gate electrode 134. The planarization process forms source contact 346 and drain contact 348, as shown.

Figure 14B:
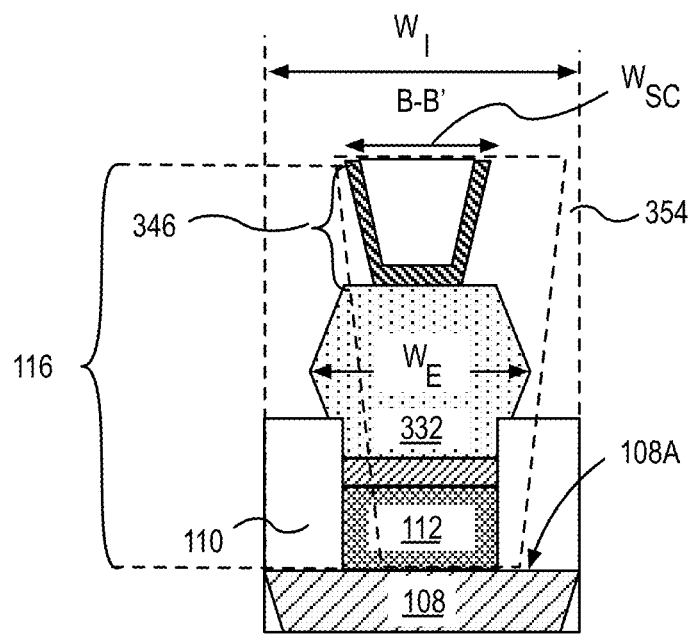
FIG. 14B is a cross-sectional illustration, through the line B-B' of the structure in FIG. 14A.

FIG. 14B is a cross-sectional illustration, through the line B-B' of the structure in FIG. 14A. In the illustrative embodiment, the source contact has a width, $W_{SC}$, (along the y-axis) is that is less than width, $W_E$ of the epitaxial source structure 332. As shown the contact does not extend on sidewalls of the epitaxial source structure 332.

In other embodiments In other embodiments, $W_{SC}$ is greater than $W_E$, as shown by the dashed line 354. In some such embodiments, the contact structure is contact with cap structure 112 and interconnect structure 108 as shown. In another embodiment, source contact 346 depicted by dashed line 354 is less wide but misaligned with respect to a midplane of the epitaxial source structure 332. In some such embodiments, source contact 346 (depicted by dashed line 354) is in contact with a portion of the interconnect structure 108 and may be in contact with cap structure 112 if the etch sufficient removes dielectric 110. It is to be appreciated that the misalignment represented by dashed line 354 does not adversely impact performance of transistor 116.

While a formation of non-planar transistor 116 is illustrated, the process described in FIG. 5A-14B may be utilized to fabricate a planar transistor or an SOI transistor, having one or more features of transistor 116.

FIG. 15A illustrates a cross-sectional view of a system 1500 including an integrated circuit structure 100. In the illustrative embodiment, the non-volatile memory element 1502 is coupled to the drain contact 132 of the transistor 116.

Non-volatile memory element 1502 may include a magnetic tunnel junction (MTJ) device, a conductive bridge random access memory (CBRAM) device, or a resistive random-access memory (RRAM) device.

FIG. 15B illustrates a cross-sectional view of an example non-volatile memory element 1502 that includes a magnetic tunnel junction (MTJ) material device. In the illustrated embodiment, the MTJ device includes a bottom electrode 1504, a fixed magnet 1506 above the bottom electrode 1504, a tunnel barrier 1508 on the fixed magnet 1506, a free magnet 1510 on the tunnel barrier 1508, and a top electrode 1512 on the free magnet 1510. In an embodiment, a dielectric spacer laterally surrounds (not shown) non-volatile memory element 1502.

In an embodiment, fixed magnet 1506 includes a material and has a thickness sufficient for maintaining a fixed magnetization. For example, fixed magnet 1506 may include an alloy such as CoFe and CoFeB. In an embodiment, fixed magnet 1506 includes $Co_{100-x-y}Fe_xB_y$, where X and Y each represent atomic percent such that X is between 50 and 80 and Y is between 10 and 40, and the sum of X and Y is less than 100. In an embodiment, X is 60 and Y is 20. In an embodiment, fixed magnet 1506 is FeB, where the concentration of boron is between 10 and 40 atomic percent of the total composition of the FeB alloy. In an embodiment, the fixed magnet 1506 has a thickness that is between 1 nm and 2.5 nm.

In an embodiment, tunnel barrier 1508 is composed of a material suitable for allowing electron current having a majority spin to pass through tunnel barrier 1508, while impeding, at least to some extent, electron current having a minority spin from passing through tunnel barrier 1508. Thus, tunnel barrier 1508 (or spin filter layer) may also be referred to as a tunneling layer for electron current of a particular spin orientation. In an embodiment, tunnel barrier 1508 includes a material such as, but not limited to, magnesium oxide (MgO) or aluminum oxide ($Al_2O_{15}$). In an embodiment, tunnel barrier 1508 including MgO has a crystal orientation that is (001) and is lattice matched to free magnet 1510 above tunnel barrier 1508 and fixed magnet 1506 below tunnel barrier 1508. In an embodiment, tunnel barrier 1508 is MgO and has a thickness is between 1 nm to 2 nm.

In an embodiment, free magnet 1510 includes a magnetic material such as Co, Ni, Fe or alloys of these materials. In an embodiment, free magnet 1510 includes a magnetic material such as FeB, CoFe and CoFeB. In an embodiment, free magnet 1510 includes a $Co_{100-x-y}Fe_xB_y$, where X and Y each represent atomic percent such that X is between 50 and 80 and Y is between 10 and 40, and the sum of X and Y is less than 100. In an embodiment, X is 60 and Y is 20. In an embodiment, free magnet 1510 is FeB, where the concentration of boron is between 10 and 40 atomic percent of the total composition of the FeB alloy. In an embodiment, free magnet 1510 has a thickness that is between 1 nm and 2.0 nm. In an embodiment, bottom electrode 1504 includes an amorphous conductive layer. In an embodiment, bottom electrode 1504 is a topographically smooth electrode. In an embodiment, bottom electrode 1504 includes a material such as W, Ta, TaN or TiN. In an embodiment, bottom electrode 1504 is composed of Ru layers interleaved with Ta layers. In an embodiment, bottom electrode 1504 has a thickness between 20 nm and 50 nm. In an embodiment, top electrode 1512 includes a material such as W, Ta, TaN or TiN. In an embodiment, top electrode 1512 has a thickness between 30 nm and 70 nm. In an embodiment, bottom electrode 1504 and top electrode 1512 are the same metal such as Ta or TiN. In an embodiment, the MTJ device has a combined total thickness of the individual layers is between 60 nm and 100 nm and a thickness is between 10 nm and 50 nm.

Referring again to FIG. 15A, in an embodiment, non-volatile memory element 1502 is a resistive random access memory (RRAM) that operates on the principle of filamentary conduction. When an RRAM device undergoes an initial voltage breakdown, a filament is formed in a layer known as a switching layer. The size of the filament depends on the magnitude of the breakdown voltage and reliable switching between different resistance states in a filamentary RRAM device can be greatly enhanced at larger current. In an embodiment, transistor 116, that can provide an additional current boost (through increase in drive current), can be advantageously coupled to an RRAM device to provide reliable switching operation.

FIG. 15C illustrates a cross-sectional view of an example non-volatile memory element 1502 that includes a resistive random-access memory (RRAM) device. In the illustrated embodiment, the RRAM material stack includes a bottom electrode 1514, a switching layer 1516 over the bottom electrode 1514, an oxygen exchange layer 1518 over the switching layer 1516, and a top electrode 1520 on the oxygen exchange layer 1518.

In an embodiment, bottom electrode 1514 includes an amorphous conductive layer. In an embodiment, bottom electrode 1514 is a topographically smooth electrode. In an embodiment, bottom electrode 1514 includes a material such as W, Ta, TaN or TiN. In an embodiment, bottom electrode 1514 is composed of Ru layers interleaved with Ta layers. In an embodiment, bottom electrode 1514 has a thickness is between 20 nm and 50 nm. In an embodiment, top electrode 1520 includes a material such as W, Ta, TaN or TiN. In an embodiment, top electrode 1520 has a thickness is between 15 nm and 70 nm. In an embodiment, bottom electrode 1514 and top electrode 1520 are the same metal such as Ta or TiN.

Switching layer 1516 may be a metal oxide, for example, including oxygen and atoms of one or more metals, such as, but not limited to Hf, Zr, Ti, Ta or W. In the case of titanium or hafnium, or tantalum with an oxidation state +4, switching layer 1516 has a chemical composition, $MO_X$, where O is oxygen and X is or is substantially close to 2. In the case of tantalum with an oxidation state +5, switching layer 1516 has a chemical composition, $M_2O_X$, where O is oxygen and X is or is substantially close to 5. In an embodiment, switching layer 1516 has a thickness is between 1 nm and 5 nm.

Oxygen exchange layer 1518 acts as a source of oxygen vacancy or as a sink for $O^{2-}$. In an embodiment, oxygen exchange layer 1518 is composed of a metal such as but not limited to, hafnium, tantalum or titanium. In an embodiment, oxygen exchange layer 1518 has a thickness is between 5 nm and 20 nm. In an embodiment, the thickness of oxygen exchange layer 1518 is at least twice the thickness of switching layer 1516. In another embodiment, the thickness of oxygen exchange layer 1518 is at least twice the thickness of switching layer 1516. In an embodiment, the RRAM device has a combined total thickness of the individual layers is between 60 nm and 100 nm and thickness is between 10 nm and 50 nm.

Referring again to FIG. 15A, the memory device 1502 is coupled to the transistor 116 through interconnect structures at a level 1522 above the transistor 116. In an embodiment, level 1522 includes a single level of interconnects coupled with the transistor 116. In other embodiments, level 1522 includes a plurality of sublevels of interconnect routing structures.

In the illustrative embodiment, the system 1500 includes a drain interconnect 1524 between the memory device 1502 and the drain contact 132. As shown, the drain interconnect 1524 is on and coupled with the drain contact 132. The system 1500 further includes a source interconnect 1526 coupled with the source contact 130 and gate interconnect 1528 coupled with the gate structure 134. In other embodiments, a gate contact is between the gate electrode 134 and the gate interconnect 1528. The memory device 1502 is further coupled to a memory interconnect 1530.

In an embodiment, source interconnect 1526, gate interconnect 1528 and drain interconnect 1524 are laterally surrounded by a dielectric layer 1532. In an embodiment, the source interconnect 1526, gate interconnect 1528, drain interconnect 1524 and memory interconnect 1530 each include titanium, tantalum, tungsten, ruthenium, copper, or nitrides of titanium, tantalum, tungsten, ruthenium. In other embodiments the source interconnect 1526, gate interconnect 1528, drain interconnect 1524 and memory interconnect 1530, include a liner layer including ruthenium or tantalum and a fill metal such as copper or tungsten. In the illustrative embodiment, the memory device 1502 and the memory interconnect 1530 is embedded in a dielectric 1534.

In an embodiment, the level 1522 further includes a barrier dielectric layer 1536 between the dielectric 1532 and dielectric 1534. In embodiments dielectric 1532 and 1534 include silicon and one or more of nitrogen, oxygen and carbon such as, silicon nitride, silicon dioxide, carbon doped silicon nitride, silicon oxynitride or silicon carbide.

In embodiments, dielectric 1536 includes silicon and one or more of nitrogen and carbon such as, silicon nitride, carbon doped silicon nitride or silicon carbide.

Figure 16:
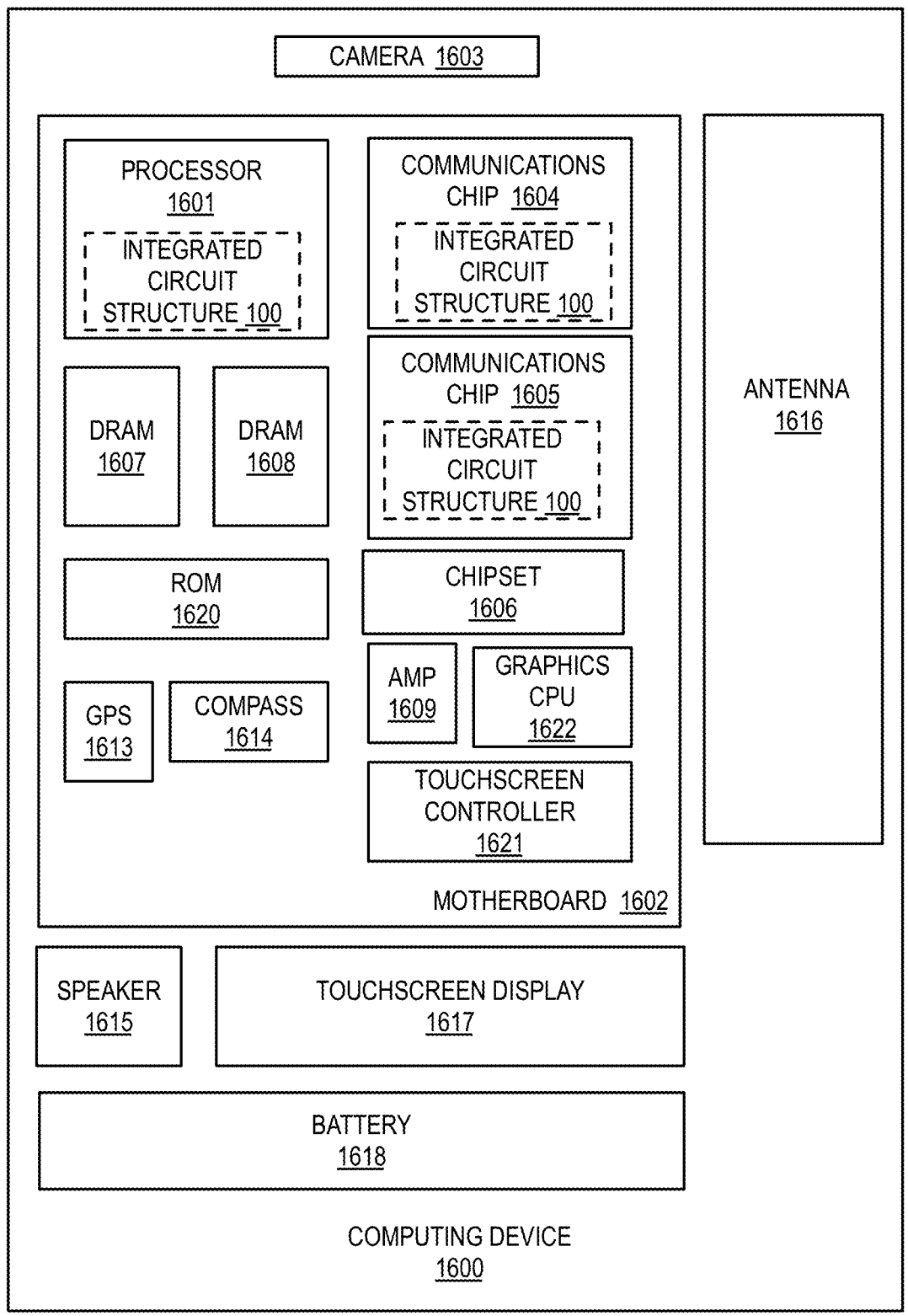
FIG. 16 illustrates a computing device in accordance with embodiments of the present disclosure.

FIG. 16 illustrates a computing device 1600 in accordance with embodiments of the present disclosure. As shown, computing device 1600 houses a motherboard 1602. Motherboard 1602 may include a number of components, including but not limited to a processor 1601 and at least one communications chip 1604 or 1605. Processor 1601 is physically and electrically coupled to the motherboard 1602. In some implementations, communications chip 1605 is also physically and electrically coupled to motherboard 1602. In further implementations, communications chip 1605 is part of processor 1601.

Depending on its applications, computing device 1600 may include other components that may or may not be physically and electrically coupled to motherboard 1602. These other components include, but are not limited to, volatile memory (e.g., DRAM), non-volatile memory (e.g., ROM), flash memory, a graphics processor, a digital signal processor, a crypto processor, a chipset 1606, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communications chip 1605 enables wireless communications for the transfer of data to and from computing device 1600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communications chip 1605 may implement any of a number of wireless standards or protocols, including but not limited to Wi-Fi (IEEE 801.11 family), WiMAX (IEEE 801.11 family), long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 1600 may include a plurality of communications chips 1604 and 1605. For instance, a first communications chip 1605 may be dedicated to shorter range wireless communications such as Wi-Fi and Bluetooth and a second communications chip 1604 may be dedicated to longer range wireless communications such as GPS, EDGE, GPRS, CDMA, WiMAX, LTE, Ev-DO, and others.

Processor 1601 of the computing device 1600 includes an integrated circuit die packaged within processor 1601. In some embodiments, the integrated circuit die of processor 1601 includes one or more integrated circuit structure 100 including self-aligned interconnect structures. The term "processor" may refer to any device or portion of a device that processes electronic data from registers and/or memory to transform that electronic data into other electronic data that may be stored in registers and/or memory.

Communications chip 1605 also includes an integrated circuit die packaged within communication chip 1605. In another embodiment, the integrated circuit die of communications chips 1604, 1605 includes one or more integrated circuit structure 100 including self-aligned interconnect structures. Depending on its applications, computing device 1600 may include other components that may or may not be physically and electrically coupled to motherboard 1602. These other components may include, but are not limited to, volatile memory (e.g., DRAM) 1607, 1608, non-volatile memory (e.g., ROM) 1620, a graphics CPU 1622, flash memory, global positioning system (GPS) device 1613, compass 1614, a chipset 1606, an antenna 1616, a power amplifier 1609, a touchscreen controller 1621, a touchscreen display 1617, a speaker 1615, a camera 1603, and a battery 1618, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like. In further embodiments, any component housed within computing device 1600 and discussed above may contain a stand-alone integrated circuit memory die that includes one or more arrays of NVM devices.

In various implementations, the computing device 1600 may be a laptop, a netbook, a notebook, an Ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 1600 may be any other electronic device that processes data.

Figure 17:
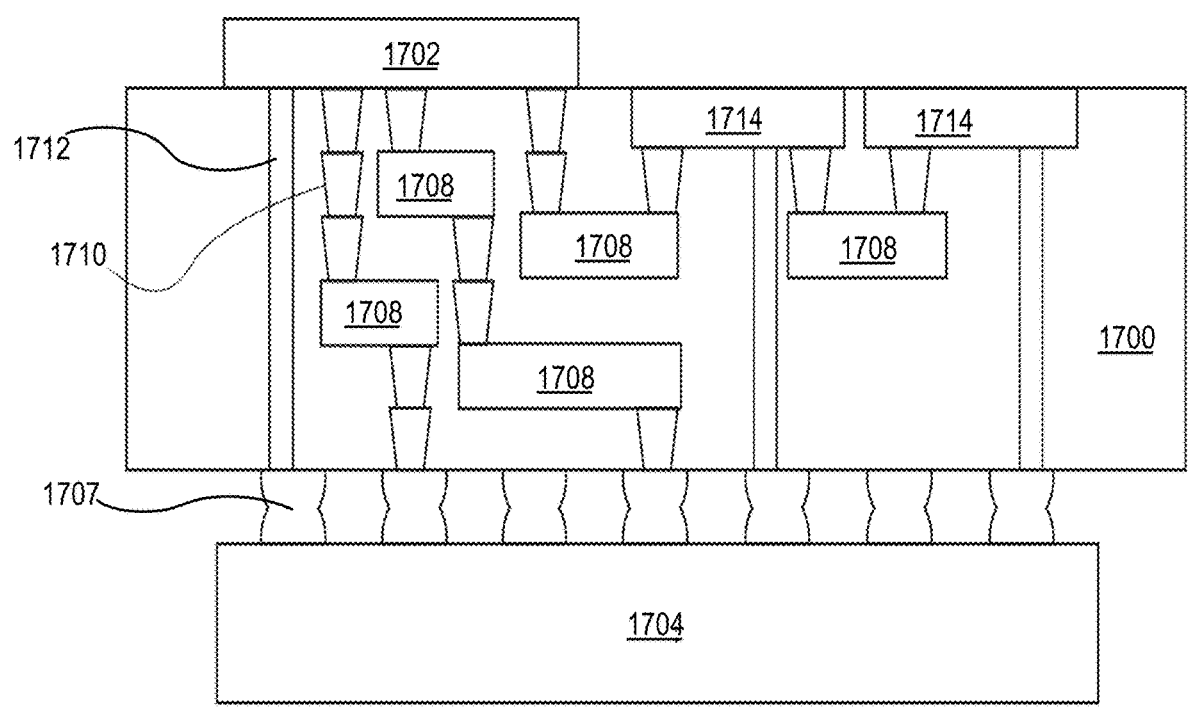
FIG. 17 illustrates an integrated circuit (IC) structure that includes one or more embodiments of the present disclosure.

FIG. 17 illustrates an integrated circuit (IC) structure 1700 that includes one or more embodiments of the disclosure. The integrated circuit (IC) structure 1700 is an intervening substrate used to bridge a first substrate 1702 to a second substrate 1704. The first substrate 1702 may be, for instance, an integrated circuit die. The second substrate 1704 may be, for instance, a memory module, a computer mother, or another integrated circuit die. Generally, the purpose of an integrated circuit (IC) structure 1700 is to spread a connection to a wider pitch or to reroute a connection to a different connection. For example, an integrated circuit (IC) structure 1700 may couple an integrated circuit die to a ball grid array (BGA) 1707 that can subsequently be coupled to the second substrate 1704. In some embodiments, the first substrate 1702 and the second substrate 1704 are attached to opposing sides of the integrated circuit (IC) structure 1700. In other embodiments, the first substrate 1702 and the second substrate 1704 are attached to the same side of the integrated circuit (IC) structure 1700. And in further embodiments, three or more substrates are interconnected by way of the integrated circuit (IC) structure 1700.

The integrated circuit (IC) structure 1700 may be formed of an epoxy resin, a fiberglass-reinforced epoxy resin, a ceramic material, or a polymer material such as polyimide. In further implementations, the integrated circuit (IC) structure may be formed of alternate rigid or flexible materials that may include the same materials described above for use in a semiconductor substrate, such as silicon, germanium, and other group III-V and group IV materials.

The integrated circuit (IC) structure may include metal interconnects 1708 and vias 1710, including but not limited to through-silicon vias (TSVs) 1712. The integrated circuit (IC) structure 1700 may further include embedded devices 1714, including both passive and active devices. Such embedded devices 1714 include capacitors, decoupling capacitors, resistors, inductors, fuses, diodes, transformers, integrated circuit structures such as integrated circuit structure 100 which includes device structure and transistor coupled through interconnect structure 108 and cap structure 112 as illustrated in FIG. 1. Referring again to FIG. 17, the integrated circuit (IC) structure 1700 may further include embedded devices 1714 such as one or more resistive random-access devices, sensors, and electrostatic discharge (ESD) devices. More complex devices such as radiofrequency (RF) devices, power amplifiers, power management devices, antennas, arrays, sensors, and MEMS devices may also be formed on the integrated circuit (IC) structure 1700.

Thus, one or more embodiments of the present disclosure relate to integrated circuit structure such as integrated circuit structure 100 described above.

In a first example, an integrated circuit interconnect structure, includes a first device level including a device structure, a metallization level above the first device level, where the metallization level includes an interconnect structure coupled to the device structure and a conductive cap on at least a portion of an uppermost surface of the interconnect structure, the conductive cap including an alloy of a metal of the interconnect structure and one of silicon or germanium. The integrated circuit interconnect structure further includes a second device level above the conductive cap, where the second device level includes a transistor coupled with the conductive cap. The transistor includes a channel layer including a semiconductor material, where at least one sidewall of the conductive cap is co-planar with a sidewall of the channel layer and a gate on a first portion of the channel layer, where the gate is between a source region and a drain region, and where one of the source or the drain region is in contact with the conductive cap.

In second examples, for any of first examples, the cap structure laterally extends beyond a perimeter of the uppermost surface of the interconnect structure by less than 2 nm.

In third examples, for any of the first through second examples, the cap does not laterally extend below the gate.

In fourth examples, for any of the first through third examples, the cap structure includes silicon, and the channel layer includes $Si_{1-x}Ge_x$, where $0<x<1$ or germanium, and where the cap structure includes germanium and the channel layer includes monocrystalline silicon or $Si_{1-x}Ge_x$, where $0<x<1$.

In fifth examples, for any of the first through fourth examples, the source region is above the cap, where the source region includes a doped epitaxial material, where the doped epitaxial material is in contact with the cap and where the drain region includes the doped epitaxial material.

In sixth examples, for any of the first through fifth examples, the source region is above the cap, and where the source region includes a recessed first portion including the material of the channel layer and a doped epitaxial material on the recessed first portion, where the epitaxially doped material is different from the material of the channel layer, and where the recessed first portion is doped and in contact with the cap.

In seventh examples, for any of the first through sixth examples, the drain region includes a recessed second portion including the material of the channel layer and the doped epitaxial material on the recessed second portion, where the doped epitaxial material is different from the material of the channel layer.

In eighth examples, for any of the first through seventh examples, the drain region is above a semiconductor layer including a material that is different from a material of the channel layer and different from a material of the cap structure, where the semiconductor layer includes one of amorphous silicon, or germanium, where the semiconductor layer is above the metallization level, and where semiconductor layer does not extend under the gate or beyond the second lowermost layer.

In ninth examples, for any of the first through eighth examples, the cap structure has a vertical thickness as measured from an uppermost surface of the interconnect structure, where the semiconductor layer has the vertical thickness, and where the vertical thickness is at least 2 nm but less than 10 nm.

In tenth examples, for any of the first through ninth examples, the integrated circuit structure further includes a dielectric below the channel layer and between the cap structure and the semiconductor layer, and further where the semiconductor layer includes a first portion and a second portion, where the first portion is under the drain region and a second substantially smaller portion is adjacent to the cap structure under the source region, where the first portion and the second portion are separated by the dielectric.

In eleventh examples, for any of the first through tenth examples, the gate is further adjacent to a sidewall and adjacent to a bottom surface of the channel layer between the cap structure and the semiconductor layer.

In twelfth examples, for any of the first through eleventh examples, the integrated circuit structure further includes a source contact on the source region and a drain contact on the drain region, where the source contact or the drain contact is in contact with a portion of an uppermost surface of the interconnect structure and a sidewall of the cap structure.

In thirteenth examples, for any of the first through twelfth examples, the channel layer has a lateral thickness along a direction orthogonal to a direction between the source region and the drain region, and where the cap structure has the lateral thickness.

In a fourteenth example, for any of the first through thirteenth examples, the metallization structure has a vertical thickness as measured from an uppermost surface of first device level, where the vertical thickness is between 10 nm and 100 nm.

In fifteenth examples, for any of the first through fourteenth examples, the gate includes a gate dielectric and a gate electrode on the gate dielectric, where the gate dielectric is adjacent and in contact with the cap structure.

In sixteenth examples, a method of fabricating an integrated circuit interconnect structure includes receiving a first substrate including a metallization structure formed above a device structure. The method further includes forming of an interconnect structure in a dielectric above the device structure and depositing a first amorphous layer on the interconnect structure and on the dielectric. The method further includes forming a second amorphous layer on a second substrate and bonding the first amorphous layer to the second amorphous layer to form a bonding layer. The method further includes converting a portion of the bonding layer directly above the interconnect structure to form a silicide or a germanide. The method further includes forming a transistor by patterning the second substrate above the bonding layer to form a channel layer, where a source or a drain portion of the channel layer is formed on at least a portion of the silicide or the germanide and forming a gate on the channel layer between the source and the drain.

In seventeenth examples, for any of the sixteenth examples, converting the bonding layer includes diffusing a metal of the interconnect structure locally to a region above the interconnect structure and fusing with silicon or a germanium in the bonding layer.

In eighteenth examples, for any of the sixteenth through seventeenth examples, patterning the second substrate to form a channel layer further includes completely etching the bonding layer and the silicide or germanide not directly under the channel layer.

In nineteenth examples, an integrated circuit interconnect structure, includes a first device level including a device structure, a metallization level above the first device level, where the metallization level includes an interconnect structure coupled to the device structure and a conductive cap on at least a portion of an uppermost surface of the interconnect structure, the conductive cap including an alloy of a metal of the interconnect structure and one of silicon or germanium. The integrated circuit interconnect structure further includes a second device level above the conductive cap, where the second device level includes a transistor coupled with the conductive cap. The transistor includes a channel layer including a semiconductor material, where at least one sidewall of the conductive cap is co-planar with a sidewall of the channel layer and a gate on a first portion of the channel layer, where the gate is between a source region and a drain region, and where one of the source or the drain region is in contact with the conductive cap and a non-volatile memory device coupled with the drain region.

In twentieth example, for any of the nineteenth example, the non-volatile memory element includes a resistive random-access memory (RRAM) device or a magnetic tunnel junction device, where the RRAM includes a bottom electrode, a switching layer above the bottom electrode and a top electrode above the switching layer, and where the MTJ device includes a fixed magnet, a tunnel barrier above the fixed magnet and a free magnet above the tunnel barrier.

What is claimed is:

1. An integrated circuit structure, comprising:
a first device level comprising a device structure;
a metallization level above the first device level, the metallization level comprising an interconnect structure coupled to the device structure;
a conductive cap on at least a portion of an uppermost surface of the interconnect structure, the conductive cap comprising an alloy of a metal of the interconnect structure and silicon or germanium; and
a second device level above the conductive cap, the second device level comprising a transistor coupled with the conductive cap, wherein the transistor comprises:
a channel layer comprising a semiconductor material; and
a gate above and below the channel layer, wherein:
the gate is between a source region and a drain region;
a sidewall of the conductive cap is adjacent to a sidewall of a portion of the gate below the channel layer; and
the source region or the drain region is in contact with the conductive cap.

2. The integrated circuit structure of claim 1, wherein the conductive cap laterally extends beyond a perimeter of the uppermost surface of the interconnect structure by less than 2 nm.

3. The integrated circuit structure of claim 1, wherein the cap does not laterally extend below the gate.

4. The integrated circuit structure of claim 1, wherein the cap comprises silicon and the channel layer comprises $Si_{1-x}Ge_x$, where $0<x<1$ or germanium, and wherein the cap comprises germanium and the channel layer comprises monocrystalline silicon or $Si_{1-x}Ge_x$, where $0<x<1$.

5. The integrated circuit structure of claim 4, wherein the source region is above the cap, wherein the source region comprises a doped epitaxial material, wherein the doped epitaxial material is in contact with the cap and wherein the drain region comprises the doped epitaxial material.

6. The integrated circuit structure of claim 4, wherein the source region is above the cap, and wherein the source region comprises a recessed first portion comprising the material of the channel layer and a doped epitaxial material on the recessed first portion, wherein the epitaxially doped material is different from the material of the channel layer, and wherein the recessed first portion is doped and in contact with the cap.

7. The integrated circuit structure of claim 6, wherein the drain region comprises a recessed second portion comprising the material of the channel layer and the doped epitaxial material on the recessed second portion, wherein the doped epitaxial material is different from the material of the channel layer.

8. The integrated circuit structure of claim 7, wherein the drain region is above a semiconductor layer coplanar with the cap and comprising a amorphous silicon or germanium.

9. The integrated circuit structure of claim 8, wherein the cap has a vertical thickness as measured from an uppermost surface of the interconnect structure, wherein the semiconductor layer has the vertical thickness, and wherein the vertical thickness is at least 2 nm but less than 10 nm.

10. The integrated circuit structure of claim 7, wherein the integrated circuit structure further comprises a dielectric below the channel layer and between the cap and the semiconductor layer.

11. The integrated circuit structure of claim 7, wherein the gate is adjacent to a sidewall and under a bottom surface of the channel layer, and wherein the gate is between the cap and the semiconductor layer.

12. The integrated circuit structure of claim 1, wherein the integrated circuit structure further comprises a source contact on the source region and a drain contact on the drain region, wherein the source contact or the drain contact is in contact with a portion of an uppermost surface of the interconnect structure and a sidewall of the cap.

13. The integrated circuit structure of claim 1, wherein the channel layer has a lateral thickness along a direction orthogonal to a direction between the source region and the drain region, and wherein the cap has the lateral thickness.

14. The integrated circuit structure of claim 1, wherein the metallization structure has a vertical thickness as measured from an uppermost surface of first device level, wherein the vertical thickness is between 10 nm and 100 nm.

15. The integrated circuit structure of claim 1, wherein the gate comprises a gate dielectric and a gate electrode on the gate dielectric.

16. A method of fabricating an integrated circuit structure, the method comprising:
  receiving a first substrate comprising a metallization structure formed above a device structure;
  forming of an interconnect structure in a dielectric above the device structure;
  depositing a first amorphous layer on the interconnect structure and on the dielectric;
  forming a second amorphous layer on a second substrate;
  bonding the first amorphous layer to the second amorphous layer to form a bonding layer;
  converting a portion of the bonding layer directly above the interconnect structure to form a silicide or a germanide comprising a metal of the interconnect structure;
  forming a transistor by patterning the second substrate above the bonding layer to form a channel layer, wherein a source or a drain portion of the channel layer is formed on at least a portion of the silicide or the germanide; and
  forming a gate on the channel layer between the source and the drain, wherein forming the gate comprises removing a sacrificial portion of the bonding layer from under the channel layer and replacing the sacrificial portion with a portion of the gate.

17. The method of claim 16, wherein converting the bonding layer comprises diffusing the metal of the interconnect structure into silicon or germanium in the bonding layer.

18. The method of claim 16, wherein patterning the second substrate to form a channel layer further comprises etching the bonding layer and the silicide or germanide completely around a perimeter of the transistor.

19. An integrated circuit structure, comprising:
  a first device level comprising a device structure;
  a metallization level above the first device level, the metallization level comprising an interconnect structure coupled to the device structure;
  a conductive cap on at least a portion of an uppermost surface of the interconnect structure, the conductive cap comprising an alloy of a metal of the interconnect structure and one of silicon or germanium, and wherein the conductive cap laterally extends beyond a perimeter of the uppermost surface of the interconnect structure by less than 2 nm; and
  a second device level above the conductive cap, the second device level comprising a transistor coupled with the conductive cap, wherein the transistor comprises:
    a channel layer comprising a semiconductor material, wherein at least one sidewall of the conductive cap is co-planar with a sidewall of the channel layer; and
    a gate on a first portion of the channel layer, wherein:
      the gate is between a source region and a drain region; and
      the source region or the drain region is in contact with the conductive cap.

20. The integrated circuit structure of claim 19, wherein the cap comprises silicon and the channel layer comprises $Si_{1-x}Ge_x$, where $0<x<1$ or germanium, and wherein the cap comprises germanium and the channel layer comprises monocrystalline silicon or $Si_{1-x}Ge_x$, where $0<x<1$.

* * * * *